(12) United States Patent
Lopez Quintela et al.

(10) Patent No.: US 10,464,047 B2
(45) Date of Patent: Nov. 5, 2019

(54) PHOTOCONVERSION OF LIGHT USING METAL SUPPORTED ATOMIC QUANTUM CLUSTERS

(71) Applicant: UNIVERSIDADE DE SANTIAGO DE COMPOSTELA, Santiago de Compostela-A Coruna (ES)

(72) Inventors: Manuel Arturo Lopez Quintela, Santiago de Compostela (ES); Jose Rivas Rey, Santiago de Compostela (ES)

(73) Assignee: UNIVERSIDADE DE SANTIAGO DE COMPOSTELA, Santiago de Compostela-A Coruna (ES)

( * ) Notice: Subject to any disclaimer, the term of this patent is extended or adjusted under 35 U.S.C. 154(b) by 452 days.

(21) Appl. No.: 14/360,658

(22) PCT Filed: Nov. 30, 2012

(86) PCT No.: PCT/EP2012/074111
§ 371 (c)(1),
(2) Date: May 27, 2014

(87) PCT Pub. No.: WO2013/079669
PCT Pub. Date: Jun. 6, 2013

(65) Prior Publication Data
US 2014/0318980 A1 Oct. 30, 2014

(30) Foreign Application Priority Data

Dec. 2, 2011 (EP) .................................. 11382375

(51) Int. Cl.
*B01J 23/52* (2006.01)
*B01J 23/40* (2006.01)
(Continued)

(52) U.S. Cl.
CPC ............ *B01J 23/52* (2013.01); *B01D 53/885* (2013.01); *B01J 19/127* (2013.01); *B01J 23/40* (2013.01);
(Continued)

(58) Field of Classification Search
CPC ........ B01J 23/52; B01J 19/127; B01J 35/004; B01J 23/48; B01J 23/70; B01J 37/16;
(Continued)

(56) References Cited

U.S. PATENT DOCUMENTS

2012/0134873 A1* 5/2012 Orner ................. B22F 1/0018
420/507
2012/0175585 A1* 7/2012 Banin .................. B22F 1/0018
257/12
2012/0315495 A1 12/2012 Lopez Quintela

FOREIGN PATENT DOCUMENTS

EP 2505616 A2 10/2012
JP 2006-305527 A 11/2006
(Continued)

OTHER PUBLICATIONS

Mahmoud et al, "Gold Nanoframes: Very High Surface Plasmon Fields and Excellent Near-Infrared Sensors," MJ. Am. Chem. Soc. 2010, vol. 132, pp. 12704-12710 (Year: 2010).*
(Continued)

*Primary Examiner* — Nicholas A Smith
*Assistant Examiner* — Colleen M Raphael
(74) *Attorney, Agent, or Firm* — Hultquist, PLLC; Steven J. Hultquist

(57) ABSTRACT

The present invention discloses the use of a metal nanoparticle which comprises at least one semiconductor attached to it, wherein the at least one semiconductor is an atomic quantum cluster (AQC) consisting of between 2 and 55 zero-valent transition metal atoms, as photocatalysts in photocatalytic processes and applications thereof.

16 Claims, 9 Drawing Sheets

(51) Int. Cl.

| | | |
|---|---|---|
| *B01J 23/48* | (2006.01) | |
| *B01J 23/70* | (2006.01) | |
| *B01J 23/89* | (2006.01) | |
| *B01J 35/00* | (2006.01) | |
| *B82Y 30/00* | (2011.01) | |
| *C01B 3/04* | (2006.01) | |
| *H01L 31/0352* | (2006.01) | |
| *B01D 53/88* | (2006.01) | |
| *C25B 1/00* | (2006.01) | |
| *B01J 19/12* | (2006.01) | |
| *H01G 9/20* | (2006.01) | |
| *H01L 31/032* | (2006.01) | |
| *B01J 37/16* | (2006.01) | |

(52) U.S. Cl.
CPC ............ *B01J 23/48* (2013.01); *B01J 23/70* (2013.01); *B01J 23/89* (2013.01); *B01J 35/004* (2013.01); *B01J 35/006* (2013.01); *B01J 37/16* (2013.01); *B82Y 30/00* (2013.01); *C01B 3/042* (2013.01); *C25B 1/003* (2013.01); *H01G 9/20* (2013.01); *H01L 31/032* (2013.01); *H01L 31/035218* (2013.01); *B01D 2255/104* (2013.01); *B01D 2255/106* (2013.01); *B01D 2255/20746* (2013.01); *B01D 2255/802* (2013.01); *B01D 2258/06* (2013.01); *B01D 2259/80* (2013.01); *B01D 2259/802* (2013.01); *B01D 2259/804* (2013.01); *B01J 2219/0892* (2013.01); *Y02E 60/364* (2013.01)

(58) Field of Classification Search
CPC . B01J 35/006; B01J 23/89; B01J 23/40; B01J 2219/0892; H01L 31/032; H01L 31/035218; H01G 9/20; B01D 53/885; B01D 2259/804; B01D 2259/802; B01D 2259/80; B01D 2258/06; B01D 2255/802; B01D 2255/20746; B01D 2255/106; B01D 2255/104; C01B 3/042; C25B 1/003; B82Y 30/00; Y02E 60/364

USPC .......................................... 204/157.52, 157.5
See application file for complete search history.

(56) References Cited

FOREIGN PATENT DOCUMENTS

| JP | 2008-221153 A | 9/2008 | |
|---|---|---|---|
| JP | 2011-045826 A | 3/2011 | |
| WO | 2008102351 A2 | 8/2008 | |
| WO | 2011064430 A2 | 6/2011 | |
| WO | WO 2011113914 A1 * | 9/2011 | ............ B22F 1/0018 |
| WO | 2012090034 A1 | 7/2012 | |

OTHER PUBLICATIONS

Costi, R., et al., "Electrostatice Force Microscopy Study of Single Au—CdSe Hybrid Nanodumbbells: Evidence for Light-Induced Charge Separation". "Nano Letters", 2009, pp. 2031-2039, vol. 9, No. 5.

Yen, C., et al., "Photocatalysis in Gold Nanocage Nanoreactors", "J. Phys. Chem. A", pp. 4340-4345, vol. 113.

Zhao, S., et al., "Novel photocatalytic applications of subnanometer gold particles for environmental liquid gas reactions", "Applied Catalysis B: Environmental", Mar. 29, 2011, pp. 239-244, vol. 104.

Attia, Y. A., et al., "Structure-Directing and High-Elciency Photocatalytic Hydrogen Production by Ag Clusters", "Journal of the American Chemical Society", Jan. 10, 2014, pp. 1182-1185, vol. 136.

Vilar-Vidal, N., et al., "Copper clusters as novel fluorescent probes for the detection and photocatalytic elimination of lead ions", "Physical Chemistry Chemical Physics", Aug. 1, 2014, pp. 26427-26430, vol. 16.

Vilar-Vidal, N., et al., "Green Emitter Copper Clusters as Highly Efficient and Reusable Visible Degradation Photocatalysts", "Small", May 30, 2014, pp. 3632-3636, vol. 10, No. 18.

* cited by examiner

PHOTOCONVERSION OF LIGHT USING METAL SUPPORTED ATOMIC QUANTUM CLUSTERS

CROSS-REFERENCE TO RELATED APPLICATIONS

This application is a U.S. national phase under the provisions of 35 U.S.C. § 371 of International Patent Application No. PCT/EP12/74111 filed Nov. 30, 2012, which in turn claims priority of EPO Patent Application No. 11382375.1 filed Dec. 2, 2011. The disclosures of such international patent application and EPO priority patent application are hereby incorporated herein by reference in their respective entireties, for all purposes.

FIELD OF THE INVENTION

The present invention relates to the use of metal nanoparticles comprising semiconductor atomic quantum clusters in photocatalysis and its applications.

BACKGROUND

Efficient charge separation after photon absorption by a semiconductor (SC) is one of the main challenges in the efficient harvesting of light energy. Improved electron-hole separation and inhibition of the photo-generated carriers (i.e. electrons or holes) are essential in improving the overall efficiency for interfacial charge transfer. In the last years several factors have been identified, which can have an important role in the separation and inhibition processes, like e.g. changes in phase composition, surface area, pore size distribution, particle morphology, particle aggregation, particle size distribution, bulk and surface defects, and impurities. Although some of these factors can be controlled to improve the performances, there is no general agreement of how some of the factors behave. For example, it is well established that crystallinity and purity are very important because they diminish the amount of defects, which can act as recombination centers. Therefore, efforts to produce highly crystalline and very pure materials to avoid defects and impurities, which increase the electron-hole recombination, have been made. But, the increase of surface area is also very important because it results in a higher density of active sites available for surface reactions (enhanced photocatalysis) as well as a higher interfacial charge-carrier transfer rate (better photovoltaic performances). It is also assumed that the recombination probability should decrease by decreasing the particle size, because the distance to the surface that carriers (formed in the interior of the SC) have to migrate to reach the active sites becomes short. Therefore, highly crystalline small particles, i.e. nanoparticles, which can increase the surface area, have been proposed (for a review of the role of nanoparticles in photocatalysis see, *Journal of Nanoparticle Research*, 1999, 1, 439-458). However, the rapid surface hole-electron recombination in nanoparticles makes that the photocatalytic and photovoltaic properties are lower than their larger counterpart.

Another important interfacial problem, mainly related with photovoltaic applications, is due to the poor interaction at the solid/solid junction, i.e. the interface between the semiconductor and the metals used for driving the current, reducing the efficiency.

The necessity of a good Ohmic contact at the semiconductor-metal interface as carrier collection is very inefficient when this interface is non-Ohmic, because such non-Ohmic contacts lead to higher overpotentials to attain a given anodic current. A metal-semiconductor junction results in an Ohmic contact (i.e. a contact with voltage independent resistance) if the Schottky barrier height is zero or negative. In such case, the carriers are free to flow in or out of the semiconductor so that there is a minimal resistance across the contact. For many semiconductors there is no appropriate metal available to get an Ohmic contact and different approaches (using thin layers, high doping levels, etc.) have to be applied to overcome this problem.

Overcoming such difficulty requires the use of intermediate layers/coatings to improve such interaction, but in any case, the efficiency is largely reduced.

Examples of solid/solid junctions between the semiconductor and the metals (metal nanoparticles) it is shown, for example, in the following patent documents:

WO 2008/102351 discloses nanoparticles comprising at least one metal/metal alloy region and at least one semiconductor region of a semiconducting material formed by elements combination selected from Groups II-VI.

WO 2011/011064 describes a method for photocatalytic splitting of water using hybrid nanoparticles which comprise a metal core and a semiconductor shell, wherein the metal core is made of a noble metal, such as Au, Ag, Pt, Pd or noble metal alloy and the semiconductor shell is made of e.g. $TiO_2$, ZnS, $Nb_2O_5$.

Therefore, new ways to improve the separation of photogenerated charge carriers should be found for increasing the efficiency in photovoltaics and photocatalysis.

In WO 2007/017550 it is disclosed that Atomic Quantum Clusters are formed by less than 500 metal atoms, nevertheless many of them, due to their quantum confinement and the consequent separation of the energy levels, may not have a metal but semiconductor or insulating character, depending on their size.

BRIEF DESCRIPTION OF THE INVENTION

The inventors of the present invention have found that Atomic Quantum Clusters (AQCs) can be used as semiconductors for light harvesting. Using AQCs supported on metal nanoparticles having equal or very similar Fermi levels, the electrons and holes generated after light irradiation can be easily separated without almost any recombination. In the case of using AQC semiconductor clusters of the same material than the supporting metal, the Fermi levels of both are equal. Therefore, in principle, an Ohmic contact will be formed at the interface. As the AQCs have such a small size, all the surface of the AQCs attached to the metal nanoparticles is considered to be in the interface AQC/nanoparticle and, therefore, all the excitons (hole-electron pairs) are formed at the interface. This fact implies an increase of interface area, a higher interfacial charge-carrier transfer rate and a decrease of the recombination probabilities, and therefore an increase in the efficacy of the semiconductor of the invention, i.e. the AQCs, compared to the traditional semiconductors known in the art, e.g. $TiO_2$, ZnO, CdS, etc.

This effect can be applied for the photoconversion of light, having applications in fields like photocurrent devices and photocatalysis employing light induced charge separation such as electrochemical and photovoltaic cells, particularly in view of the surprising discovery that photocatalysis may be achieved by simply exposing the systems disclosed herein to solar radiation. This leads to the development of a great variety of photocatalytic methods and devices useful in chemical transformations such as those disclosed herein, in particular those associated with the decomposition of environmental contaminants and water splitting.

This effect has been surprisingly and unexpectedly found when Au nanorods comprising Ag AQCs at the nanorod's tips were illuminated with light and it was observed their completely dissolution into Au(III) ions. This fact is contrary to any expectation, because it is well-known that Au, even in the form of nanoparticles, is totally inert against light irradiation of low intensity, like the one used for the examples described herein.

Therefore, one aspect of the present invention relates to the use of a metal nanoparticle comprising at least one semiconductor attached to it, wherein the at least one semiconductor is an atomic quantum cluster (AQC) consisting of between 2 and 55 zero-valent transition metal atoms, as photocatalysts in photocatalytic processes.

Another aspect refers to a composition that comprises:
a metal nanoparticle which comprises at least one semiconductor attached to it, wherein the at least one semiconductor is an atomic quantum cluster (AQC) consisting of between 2 and 55 zero-valent transition metal atoms,
at least one electron acceptor and
at least one electron donor.

Another further aspect of the present invention refers to a photocatalytic process which comprises the step of contacting, i.e. mixing together or bringing together, a metal nanoparticle, which comprises at least one semiconductor attached to it, wherein the at least one semiconductor is an atomic quantum cluster (AQC) consisting of between 2 and 55 zero-valent transition metal atoms, with at least one electron acceptor and at least one electron donor.

In a further aspect of the invention is provided a device for the photocatalysis of chemical reactions comprising at least one metal nanoparticle of the invention.

Another aspect provides a photovoltaic cell comprising at least one metal nanoparticle of the invention.

In yet another aspect of the invention there is provided a method for photocatalytic production of hydrogen, said method comprising irradiating an aqueous medium comprising at least one nanoparticle, as disclosed herein, and optionally at least one other charge carrier acceptor, with light in the UV, visible and/or near IR range; said light being optionally solar light to obtain hydrogen following water splitting.

DETAILED DESCRIPTION OF THE INVENTION

Figure 1:
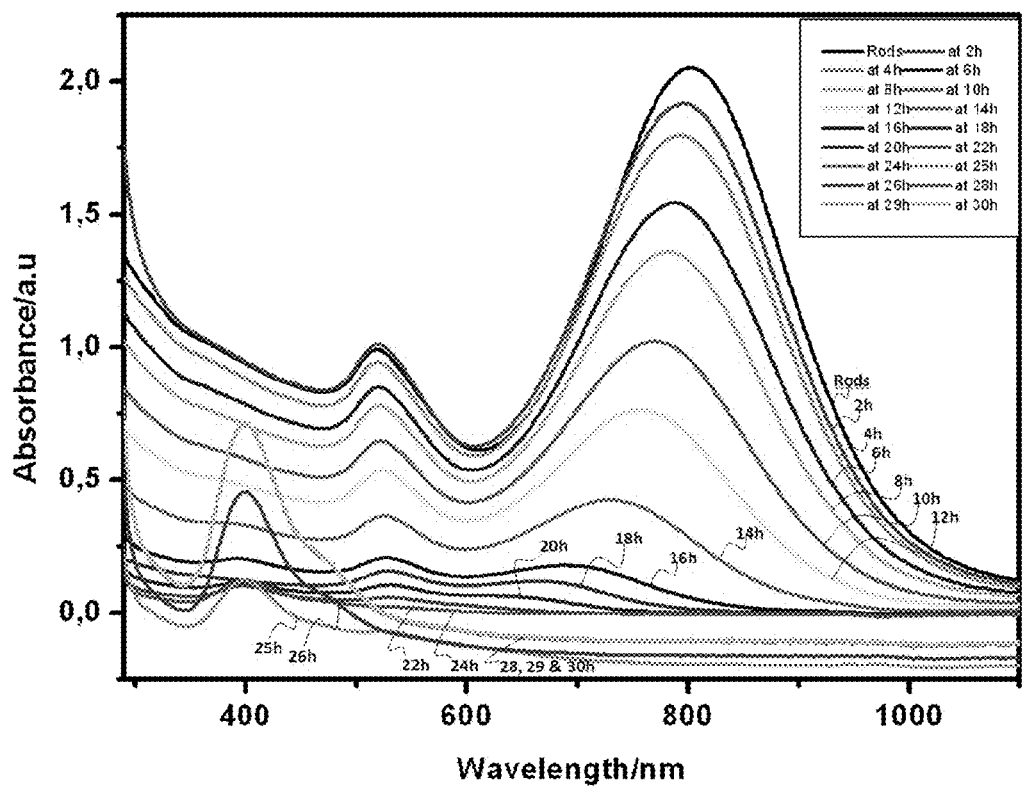
FIG. 1. UV-Vis absorption spectra showing the change of gold nanorods of aspect ratio=3.7 and pH=3.9 after irradiation by UV-light for ~30 hrs at room temperature, leading to the complete dissolution of the rods and the formation of Au(III)-CTAB complex, with its characteristic band at 398 nm with a shoulder at 478 nm.

In the context of the present invention, the following terms have the meaning detailed below.

The nanoparticles of the invention are metal nanoparticles which are discrete entities wherein, in a preferred embodiment, at least one of its dimensions (e.g., diameter, length, etc) is between 1 nm and 60 µm. When the overall shape of the nanoparticle is spherical or disk-like, the largest dimension is the diameter of the sphere or disk, and they comprise an AQC attached to it.

In a particular embodiment the prepared nanoparticles are nanofibers or nanorods, said nanofibers or nanorods having a length between about 60-40 µm and a diameter between about 110-90 nm, and preferably they have a length of about 50 µm and a diameter of about 100 nm.

Therefore, the expression "the nanoparticle(s) of the invention" means in the present description "metal nanoparticle comprising at least one semiconductor attached to it, wherein the at least one semiconductor is an atomic quantum cluster (AQC) consisting of between 2 and 55 zero-valent transition metal atoms". The term "attached to it" in the definition of "the nanoparticle(s) of the invention" means "bound to it", i.e. both are part of the same entity or compound, the at least one semiconductor belongs to "the nanoparticle(s) of the invention", it is not a mere contact.

Notwithstanding the above, the nanoparticle of the invention can have any shape and symmetry, and may display branched and net structures. Without being limited thereto, the nanoparticle may be symmetrical or unsymmetrical, may be elongated having nanorod, nanofibre, nanotriangle, nanostar, nanodisc, nanocube, nanotetrahedron and nanoprism shape, preferably the metal nanoparticle shape or form is nanorods.

In one embodiment, the metal of the metal nanoparticles is selected from Au, Ag, Co, Cu, Pt, Fe, Cr, Pd, Ni, Rh, Pb and combinations thereof. In another embodiment, the metal of the metal nanoparticles is preferably selected from Ag, Au, Pt, Pd and combinations thereof. In a preferred embodiment the metal of the metal nanoparticles is preferably Au. In another embodiment the nanoparticle is a metal alloy nanoparticle. The metal alloy nanoparticle comprise a mixture of atoms in which the primary constituent is a metal as the one described above and the secondary(ies) constituent(s) is/are other non-metal elements e.g. P, C, Si, S, As, etc.

As will be further detailed hereinbelow, for the nanoparticles to have efficient photocatalytic activity, they must be constructed as nanoparticles comprising each at least one metal/metal alloy nanoparticle region, the nanoparticle itself, and at least one semiconductor region, which in this case the semiconductor is the Atomic Quantum Cluster which is attached to the metal/metal alloy nanoparticle, having an absorption onset from the ultraviolet (UV) (200 nm) to near infrared (NIR) range (0.7-3 µm).

The Atomic Quantum Clusters (AQCs) are described in patent ES2277531 B2, WO 2007/017550. Therefore, in the state of the art, AQCs are understood as material formed exclusively by zero-oxidation-state (i.e. zero-valent) transition metal atoms, $M_n$, stable over time, with less than 200 metal atoms ($M_n$, n<200) and with a size of less than 2 nm. In this particular invention, the AQCs attached to the metal nanoparticles are formed by between 2 and 55 zero-oxidation-state transition metal atoms ($M_n$, $2 \leq n \leq 55$). In another embodiment, the AQCs consist of between 2 to 27 zero-valent transition metal atoms ($M_n$, $2 \leq n \leq 27$). In a further embodiment the AQCs consist of between 2 to 15 ($M_n$, $2 \leq n \leq 15$) zero-valent transition metal atoms. In another further embodiment the AQCs consist of between 2 to 5 ($M_n$, $2 \leq n \leq 5$) zero-valent transition metal atoms.

In one embodiment the mean size of the AQCs is between 0.3 nm and 1.2 nm, in a particular embodiment the size is less than 1 nm. In a preferable embodiment they have an approximate size between 0.3 nm and 0.9 nm, and in another embodiment between 0.3 nm and 0.5 nm.

The zero-oxidation-state transition metal atoms of the AQCs present in the invention are selected from Au, Ag, Co, Cu, Pt, Fe, Cr, Pd, Ni, Rh, Pb and combinations thereof. Preferably the transition metal atoms are selected from Ag, Au, Pt, Pd and combinations thereof and more preferably the AQC is formed by Ag zero-oxidation-state atoms.

It should be understood that the "at least one" semiconductor is "at least one type of" semiconductor, i.e. at least one type of AQC, wherein "type" refers to the different AQCs with different sizes (i.e. with different number of zero-valent metal atoms), geometries and transition metals. Therefore, it is possible that different types of AQCs are present attached to the same nanoparticle.

In one embodiment the zero-valent transition metal atoms of the AQC and the metal of the nanoparticle present are the same transition metal.

In another embodiment the zero-valent transition metal atoms of the AQC and the transition metal of the nanoparticle are different transition metals.

Figure 9A:
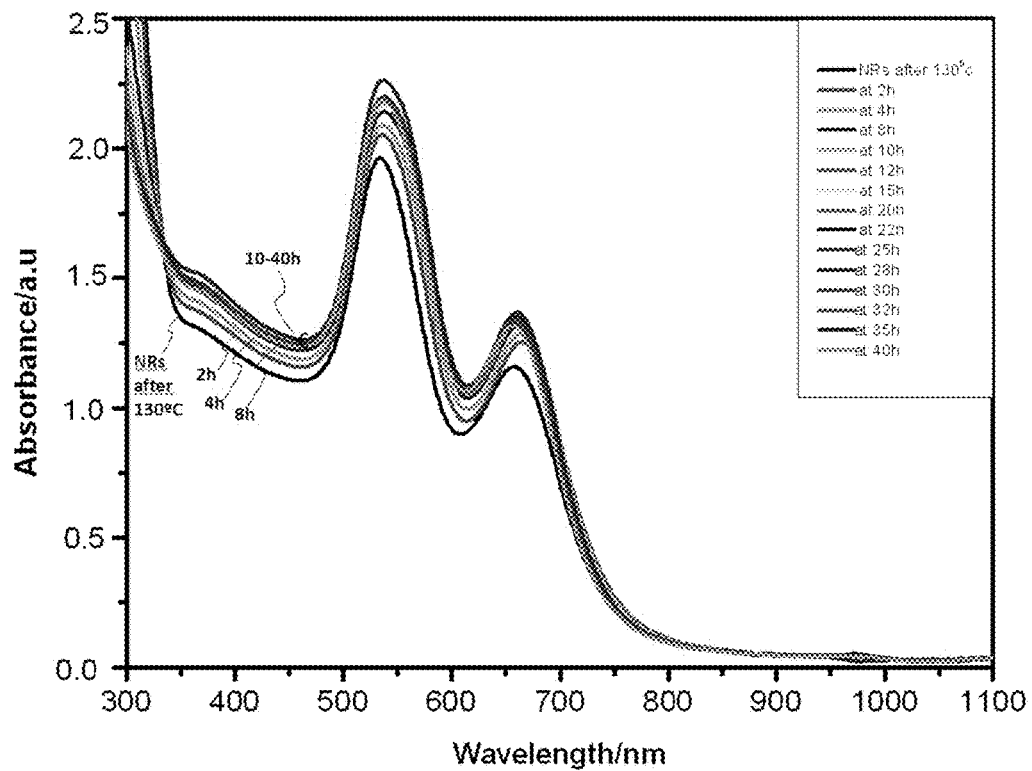
FIG. 9. A) Absorption spectra of gold nanorods preheated at 130° C. during 2 h and then irradiated with UV-light during 2, 4, 8, 10, 12, 15, 20, 22, 25, 28, 30, 32, 35 and 40 hours (h). Only a small increase in the absorbance is observed, which is due to some the evaporation of the solvent during the experiment. The presence of the two bands with approximately the same intensity after 40 hours clearly shows that the dissolution of rods is totally inhibited by the elimination (melting) of clusters by heating. B) Absorption spectra of gold nanorods preheated at 130° C. during 2 h and then irradiated with UV-light during 30 minutes, 45 minutes, 1, 2, 3, 4, 5 and 6 hours, after adding externally prepared Ag clusters before irradiating the sample. It is observed that the presence of clusters induce the dissolution of rods.
Figure 9B:
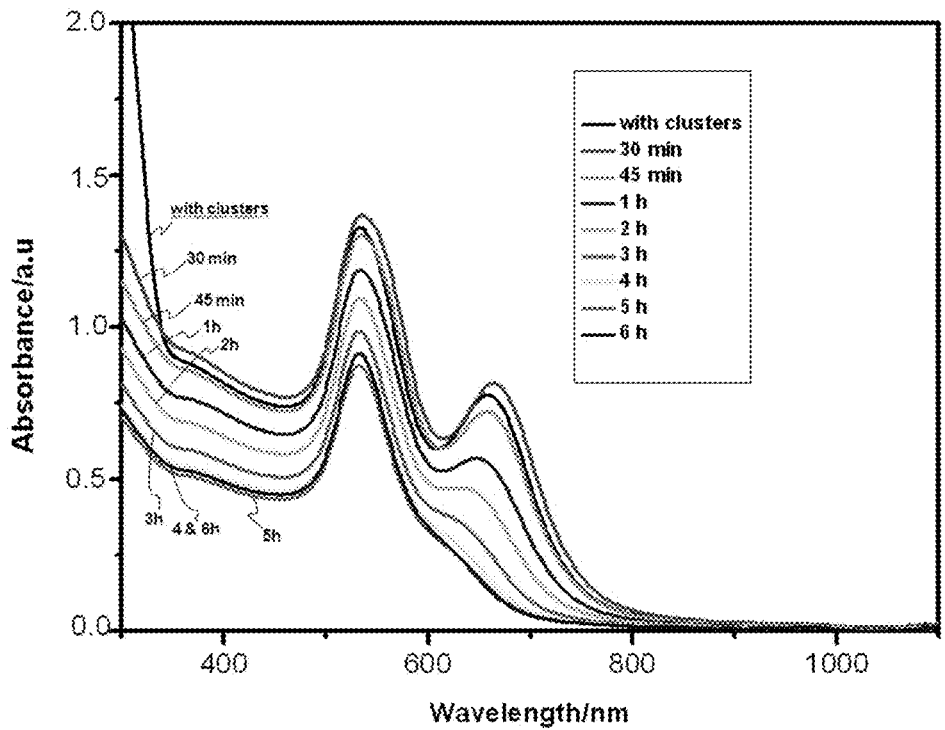

A process for preparing the anisotropic metal nanoparticle of the invention comprising at least one metallic atomic quantum cluster (AQC) attached to it, is described in the patent application WO 2011/113914. Said process comprises the step of reducing a metal cation to oxidation state zero in the presence of an atomic quantum cluster (AQC) (previously synthesized and isolated) and a solvent. Other processes for preparing the nanoparticles of the invention include the formation of AQCs in situ, like the so-called seed-mediated methods, as shown in Example 1, a). Another further process for obtaining the nanoparticles of the invention consists on adding AQCs to a solution having the metal nanoparticles (as it is proved by example 7 and FIG. 9B).

The anisotropic metal nanoparticles obtained, e.g. by the process described in WO 2011/113914, comprise the AQCs attached to the nanoparticles and can have different shapes or types of structure. For example, shapes of nanoparticles that can be obtained by the different processes are:

nanorods which are nanoparticles of one dimension, i.e. the nanoparticles have been elongated anisotropically in one direction, they can be found as well in the literature as nanocylinders, nanofibers, nanowires or nanotubes;

nanodiscs, which are nanoparticles of two dimensions, i.e. the nanostructures have grown in two directions, they are bidimensional, e.g. nanotriangles, nanosquares, etc., and nanostructures elongated in three or more directions, i.e. tridimensional structures, e.g. nanostars, nanocubes, nanotetrahedrons or nanoprisms.

In one embodiment, the AQCs are attached to the tips of the nanoparticles. This kind of nanoparticules are normally found when the nanoparticles are grown as described in WO 2011/113914.

In another embodiment, the AQCs are attached mainly to the tips of the nanoparticles but they can be attached to other regions of the nanoparticle. Other processes to obtain the metal nanoparticles allow a different place of attachment of the AQCs to the nanoparticles.

In one embodiment, a nanorod has at least one AQC attached to it, and in a particular embodiment it is attached to one of the tips of the nanorod. In another embodiment, a nanorod has at least two AQCs attached to it, particularly at least one AQC in each of the tips of the nanorod. In another further embodiment, a nanorod has at least two, three, four, five, six or more types of AQCs attached to it. When here is said nanorod, it should be understood any of the one dimension nanoparticles mentioned above, i.e. nanocylinders, nanofibers, nanowires or nanotubes. When here is said one type of AQCs, it should be understood AQCs of a particular size, geometry or metal.

In one embodiment a nanodisc has one, two, three or four AQCs attached. In a particular embodiment at least one AQC is attached to one of its tips, and more particularly one AQC attached to each tip of the nanoparticle. When here is said nanodiscs it should be understood any of the two-dimensional nanoparticles, e.g. nanotriangles, nanosquares, etc.

In another embodiment nanoparticles elongated in three or more directions have one, two, three, four, five, six or more AQCs attached to the nanoparticle. Particularly at least one AQC attached to one of its tips, more particularly one AQC attached to each tip of the nanoparticle.

It is understood that when the metal nanoparticles of the invention, or the medium containing them, are irradiated with light, the light may be directed to the nanoparticles or, in a general manner, to the medium that comprises that nanoparticles. As it will be shown in the Examples, e.g. example 1 b), after illumination of the medium comprising the nanoparticles of the invention, the dissolution of the nanoparticles begins by the tips, where the AQCs are attached, diminishing the aspect ratio of the nanoparticles, for example, when the nanoparticles are nanorods, until spherical nanoparticles are formed. Further dissolution/oxidation of the spherical nanoparticles gives rise to the complete dissolution of the metal and the formation of the metal salt, e.g. in case of the Au nanorods of the example, the Au(III) salt is formed.

For applications, it is important that not only the used semiconductor, in our case the semiconductor AQCs, but also the conducting metal used for the photocatalytic or photovoltaic applications, is stable under irradiation. As it is shown in the example 4, one can use a hole scavenger to avoid the dissolution of the metal supporting the AQCs.

In one embodiment alcohol can be used as hole scavenger inhibiting the metal for dissolution, so that the metal is stable under irradiation. Non-limiting examples of alcohols that can be used as hole scavengers are methanol, propanol, glycerol, vinylalcohol, polyvinylalcohol; other non-limiting examples of hole scavengers are complexes such as EDTA; benzene; iodide salts; alquilammonium salts, such as propylammonium nitrate, or tetralkylamonium salts such as tetrabuthylamonium bromide; alcohol amines such as triethanol amine; water and organic acids such as acetic acid, salicylic acid, etc.

As it will be shown also in the Examples the AQCs are very stable under irradiation as it can be checked because after complete dissolution of the Au nanorods, AQCs are present in the final Au(III) solution and they can be used to reform again the nanorods using a new set of reactants.

Example 1 shows a totally surprising and unexpected result, because it is well known that Au is a noble metal, which cannot be oxidized by UV-light. However, the results indicate that the gold nanorods (Au NRs) show a similar behaviour than that displayed by semiconductors in which photocorrosion can takes place. This can be explained taking into account the results shown in the patent application WO 2011/113914. In that patent application, it was demonstrated that atomic quantum clusters (AQCs) play an important role in the formation of Au nanorods (Au NRs) (in this particular example, Ag AQCs are formed from the Ag salt used to produce the Au NRs). In WO 2011/113914 it was also shown that clusters catalyse the growth of the initial seeds in a particular direction because they are attached preferentially to a particular plane of the seeds. These catalytic Ag clusters remain attached to that planes (located in the tips of the rods), probably protected by the surfactant CTAB, after the synthesis. These Ag clusters attached to the rods, which have semiconductor properties (as it was shown e.g. WO 2007/017550), with absorption bands in the UV-vis-IR range, when they are illuminated with appropriate light, can absorb photons forming an exciton. Because the Fermi level of the Au NRs and the attached Ag clusters are similar, electrons and holes can easily be separated at the surface of the Au NRs and they can act as reduction/oxidation agents instead of been recombined to produce fluorescence. The easy separation of electron and holes at the surface of Au is due to the very small (or zero) binding energy of the exciton because of the good electric shielding properties of the metal. These sub-nano cluster/metal sub-nanojunctions should behave as perfect non-ohmic contacts and are ideal for an effective electron-hole separation. The generated electrons, with a much higher energy than the Au Fermi level, can easily be thermalized losing their energy by interactions with the phonons of the metal lattice, or be captured by electron scavengers present in the system (e.g. oxygen). However, holes generated at the gold surface can be very active as reduction agents. According to the scheme represented in scheme of FIG. 8, which shows an approximate representation of the cluster HOMO-LUMO levels (valence and conduction bands in semiconductors), Au atoms (located at the surface of the Au NRs at which clusters are adsorbed) will be oxidized and easily dissolved. This explains the oxidation and dissolution of the Au NRs. In order to understand the dissolution phenomena one has to think that the adsorption of clusters to the surface is a dynamic process, being the clusters-stabilized by CTAB-attached/de-attached from the Au surface, which is the mechanism proposed to explain their catalytic behaviour observed for the directed growth of the formation of Au NRs, without being the clusters incorporated ("swallowed") into the Au lattice. Similarly, it explains that clusters can be continuously adsorbed/desorbed to the preferential planes of the continuously reshaping/dissolving NRs.

As stated above, the metal nanoparticle employed by the present invention comprises at least one atomic quantum cluster (AQC) attached to it, therefore forming at least two different regions:
- the one region being of at least one semiconducting material, i.e. the AQCs, and
- the second region being of a metal/metal alloy material, i.e. the metal nanoparticle, with the electron-hole pairs being formed at the surface of the AQCs, or semiconductor. As the AQCs are of a size of between 0.3 and 1.2 nm, and they consists of between 2 and 55 zero-valent transition metal atoms, almost all the atoms of the AQCs attached to the metal nanoparticle are considered to be in the interface AQC/nanoparticle. Thus, the electron-hole pairs being formed at the surface of the AQCs, or semiconductor, are formed at the interface AQC/nanoparticle.

In the presence of an electron acceptor and/or a hole acceptor, the electron and hole, independently, are transferred to their respective acceptors.

The metal/metal alloy nanoparticle is thus chosen so that by tuning the Fermi energy level of the metal, and the tuning of the band structure of the AQC or semiconductor by size, geometry and composition permits a better separation of the charge carrier (electron or hole). The metal/metal alloy nanoparticle further provides its catalytic activity for ensuing photochemical reactions.

Photocatalysis is the acceleration of a photoreaction in the presence of a catalyst. In photo-generated catalysis the photocatalytic activity depends on the ability of a catalyst (a photocatalyst) to absorb light and create electron-hole pairs, i.e. induce charge separation by creating charge carriers (electrons and holes), which can later enable photocatalytic processes, e.g. secondary reduction-oxidation (redox) reactions, by transferring the charge carriers to the charge acceptors, i.e. electron acceptor or hole acceptor.

The photocatalyst is a catalytic substance causing a catalytic reaction if light is radiated there onto. In the present specification, it means a catalytic substance capable of accelerating a photoreaction, and particularly, a substance having an absorption onset in the ultraviolet (UV) (200 nm) to near infrared (NIR) range (0.7-3 μm), to produce a material having oxidizing or reducing power. A photocatalyst may be used to treat a great amount of chemicals or nondegradable contaminants in an environmentally friendly manner.

As described in the European patent application EP11382196, an approximate estimation of the AQCs excitation and emission wavelengths can be determined by approximation by means of the Jellium model (see for example J. Calvo et al., *Encyclopedia of Nanotechnology*, Ed. by B. Bhushan, Springer Verlag, 2011). This model predicts in a rather approximate manner the energy bandgap of the clusters and, therefore, the position of the emission bandgap thereof. The excitation bandgap of the clusters can in turn be predicted from the emission bandgap taking into account that the Stokes shift in clusters of a particular size is of approximate 50-100 nm. The following table, Table 1, shows the theoretical data for AQCs of Au or Ag according to this model, i.e., the approximate excitation $\lambda_{exc.}$, and emission, $\lambda_{em.}$, wavelengths have been calculated with an error of ±50 nm in AQCs of Au or Ag by means of said Jellium model: $E_{em}=E_F/N^{1/3}$; where $E_{em}$=emission energy; N=no. of atoms in the AQC; and $E_F$=Fermi level which is the same approximately 5.5 eV for gold and silver.

TABLE 1

| Cluster | $\lambda_{exc.}$(nm) | $\lambda_{em.}$ (nm) |
|---|---|---|
| $A_2$ | 200-250 | 300 |
| $A_3$ | 240-290 | 340 |
| $A_4$ | 270-320 | 370 |
| $A_5$ | 300-350 | 400 |
| $A_6$ | 325-375 | 425 |
| $A_7$ | 350-400 | 450 |
| $A_{10}$ | 400-450 | 500 |
| $A_{12}$ | 440-490 | 540 |
| $A_{15}$ | 475-525 | 575 |
| $A_{20}$ | 535-585 | 635 |
| $A_{25}$ | 580-630 | 680 |
| $A_{30}$ | 630-680 | 730 |
| $A_{40}$ | 700-750 | 800 |

In one embodiment the AQCs of the invention have absorption onset in the ultraviolet (UV) (200 nm) to near infrared (NIR) range (0.7-3 μm).

In some embodiments he AQCs of the invention have absorption onset in the ultraviolet (UV) (200 nm) to the visible (400-700 nm) range.

In another embodiments the AQCs of the invention have absorption onset in the visible (400-700 nm) to near infrared (NIR) range (0.7-3 μm).

In some embodiments, the at least one AQC has an absorption onset in the range of 200 nm to 800 nm.

In some embodiments, the at least one AQC has an absorption onset in the range of 250 nm to 750 nm.

In further embodiments, the at least one AQC has an absorption onset in the range of 3000 nm to 700 nm.

In one embodiment the wavelength of the light to be absorbed can be fine-tuned from the UV to the NIR range just by changing the size of the AQCs employed.

In another embodiment the wavelength of the light to be absorbed can be fine-tuned from the UV to the visible range just by changing the size of the AQCs employed.

In another embodiment the wavelength of the light to be absorbed can be tuned in the whole spectrum of solar light just by selecting a mixture of AQCs to cover the whole spectrum.

The nanoparticles employed in this invention as photocatalysts, in accordance with the present invention, are irradiated, i.e. illuminated, with a light source having an energy of the same wavelength of the maximum excitation wavelength of the AQCs.

After the appropriate irradiation, electrons and positive holes are formed in the form of an electron-hole pair at the AQC surface, i.e. at the metal nanoparticle/AQC interface. As a person skilled in the art would recognize, the "metal/AQC interface" ("metal/semiconductor interface") consists of the area of the nanoparticle faces at which the AQCs are attached. From a physical point of view, the interface is the point at which the two Fermi levels (of the metal nanoparticle and the AQC) equalize when in equilibrium.

Therefore, the term "attached" is the same as "located at" or "in contact with" and in this invention means that the metal nanoparticles and the AQCs are in contact, particularly they are in contact at the "metal/AQC interface".

In a particular embodiment the atomic quantum cluster and the metal nanoparticles have similar Fermi levels, wherein "similar" Fermi levels means that the difference between the Fermi levels of the semiconductor atomic quantum clusters and the metal nanoparticles is not bigger than 1.5 eV, preferably not bigger than 1 eV, preferably not bigger than 500 meV, preferably the difference of Fermi levels is between 0.01 and 200 meV. In another embodiment there is no difference between the Fermi leves, i.e. the Fermi levels are the same or the difference of Fermi levels is 0. The Fermi level is a measure of the energy of the least tightly held electrons within a solid. The value of the Fermi level at absolute zero (−273.15° C.) is called the Fermi energy and is a constant for each solid. The Fermi level changes as the solid is warmed and as electrons are added to or withdrawn from the solid. The Fermi level is any energy level having the probability that it is exactly half filled with electrons. Levels of lower energy than the Fermi level tend to be entirely filled with electrons, whereas energy levels higher than the Fermi tend to be empty.

Therefore, the Fermi levels in this invention are considered as the known Fermi energies at absolute zero from the literature, e.g.:

| | Element | | | | | | | | | |
|---|---|---|---|---|---|---|---|---|---|---|
| | Cu | Ag | Au | Fe | Mn | Zn | Cd | Hg | Sn | Pb |
| Fermi Energy (eV) | 7.00 | 5.49 | 5.53 | 11.1 | 10.9 | 9.47 | 7.47 | 7.13 | 10.2 | 9.47 |

Once the nanoparticle comprising the at least one AQC is illuminated, the electrons and positive holes generated at the interface are very fast separated because the shielding of the high density of electrons in the metal does not allow the binding of the electrons and holes forming excitons, like it occurs in normal semiconductors, which would increase the probability of recombination, and therefore, decrease the efficiency of the photoconversion of photons into electrons and holes. Due to this charge separation, the electrons and positive holes generated are capable of provoking various reactions, herein referred to as "photocatalytic processes", by interacting with neighboring electron acceptor and/or electron donor molecules. The high yield of electrons and holes generated can then be used in different devices and processes, like e.g. for the production of photocurrent and photocatalysis. Since the holes so generated have oxidizing power, and the electrons have reducing power, the nanoparticles of the invention acting as photocatalysts can catalyze a reduction-oxidation (redox) reaction as long as electrons and holes are formed, e.g. by light-activation.

For oxidation reactions, the nanoparticles are not consumed in the process because the substances to be oxidized act as effective hole scavengers and therefore the nanoparticles are not dissolved and do not lose their ability to undergo the light-induced process described (thus termed "photocatalysts"), and their function depends only on the presence of the light source.

In the case of reduction reactions, a convenient hole scavenger has to be used to prevent the oxidation/dissolution of the metal nanoparticles. In this case, in the presence of light, the generated electrons can be used to produce the desired reduction reaction. Another possibility is that, in the presence of hole scavengers and in the absence of any electron scavenger, like $O_2$, $Cl^-$, $SO_4^{2-}$, $NO_3^-$, $HCO_3^-$, $PO_4^{3-}$ etc., electrons can be accumulated into the metal and be used later on to undergo the reduction reaction even in the absence of light. As it is shown e.g. in example 6, and in the scheme of FIG. 8, the accumulation of electrons in the particles increases their Fermi level. This increase in the Fermi level can be used to reduce substances that have much smaller redox potentials (or even negative redox potentials in non-aqueous media) than the redox potential of the used metal for the nanoparticles.

As stated hereinabove, the nanoparticles, populations containing them, or nanostructures thereof, in accordance with the invention may be used as photocatalysts in a variety of photocatalytic processes (or photo-induced reactions). Non-limiting examples of photocatalytic processes may be water splitting, purifications of water and air from contaminates through e.g., decomposition of such contaminants; deodorization; treatment of industrial effluent and exhaust; chemical transformation of organic contaminants, such as residues from the dye industry, into less toxic and more environmentally safe agents; antibacterial applications; anti-clouding applications, and generally any chemical reaction involving reduction-oxidation reactions for the production of a desired intermediate(s) or end product(s) or for the elimination of a harmful contaminate.

In one embodiment, the photo-induced reaction is water splitting.

In other embodiments, the water splitting reaction is induced by sunlight.

As state above, the photocatalytic process comprises the step of:
contacting, i.e. mixing together or bringing together, at least one metal nanoparticle comprising at least one atomic quantum cluster attached to it with at least one electron acceptor and at least one electron donor.

Therefore, it is also an object of this invention, a composition that comprises:
a metal nanoparticle which comprises at least one semiconductor attached to it, wherein the at least one semiconductor is an atomic quantum cluster (AQC) consisting of between 2 and 55 zero-valent transition metal atoms,
at least one electron acceptor and
at least one electron donor.

In one embodiment the contacting (or mixing together or bringing together) step is performed in a medium selected from a liquid medium, a gel, a polymer, a film, an electrode or a surface medium. In a particular embodiment the liquid is aqueous, i.e. comprises water. In another particular embodiment the liquid is not aqueous.

For catalyzing photochemical reactions, a single as well as a plurality of nanoparticles may be employed. A plurality or a population of nanoparticles may be characterized as a collection (blend) of nanoparticles, each characterized as disclosed herein, wherein the population is further characterized as having at least one of chemical processability and/or predefined distribution. In some embodiments, a population of nanoparticles is characterized as having both chemical processability and predefined distribution.

Therefore, in some embodiments, the metal nanoparticle is a population of nanoparticles or a plurality of nanoparticles comprising atomic quantum clusters (AQC).

In some other embodiments, the population of nanoparticles is homogenous, namely containing a single type of nanoparticles or heterogeneous, namely containing a blend of nanoparticles.

The chemical processability of the nanoparticle population refers to the ability to manipulate and chemically modify and treat the surface of the nanoparticles to obtain a controlled distribution of the nanoparticles in a medium in which homogenous or predetermined distribution is sought. Such a medium may be a liquid medium, including aqueous and non-aqueous solutions, a gel, or a solid medium such as a polymer, a film, an electrode and various other surfaces, or mixtures thereof.

In some embodiments, a plurality of said nanoparticles comprising atomic quantum clusters (AQC) is freely distributed in said medium. In some other embodiments the nanoparticles have a predefined distribution.

In this invention "freely" means that the nanoparticles are distributed in the medium without external control, i.e. distributed by the only effect of being added to the medium, and optionally mixed.

The expression "predefined distribution" or "pre-determined distribution" means that the nanoparticles are distributed in the medium with an external control in order to obtain a fixed or marked distribution, e.g. having a distribution where the nanorods are distributed in a parallel manner and aligned with the light source, in such a way that the light is applied directly to the AQCs.

In some embodiments, the distribution is in the form of an aggregate or aggregated net-like distribution. In other embodiments, the distribution is in the form of a non-aggregated net-like distribution.

The photocatalytic process optionally comprises the step of irradiating the medium containing said at least one metal nanoparticle comprising at least one atomic quantum cluster (AQC), at least one electron acceptor and at least one electron donor with a radiation comprised from the ultraviolet to the near IR range. In another embodiment the medium is irradiated with solar light.

As stated above, the nanoparticles of the present invention have a relatively narrow size distribution, namely they are manufactured in a relatively narrow range of sizes. In fact, the standard deviation (sigma) of the nanoparticles' size in a single population is typically less than 25%. In some embodiments, the deviation in the particles size is less than 15%. Where the nanoparticles are elongated (nanorods) the sigma of the length of a single population is less than 35% and the sigma of the width is less than 15%.

The narrow size distribution allows the designing of homogenous populations of nanoparticles having one or more of the following advantages:
a) reproducibility of the photocatalytic reactions employing such populations,
b) simplified arrangements and assemblies in arrays, and/or
c) ability of tuning the electronic properties including the absorption to optimize harnessing solar energy and band alignment to optimize the photocatalytic activity.

In some embodiments, the population of nanoparticles is homogenous in that said population comprises nanoparticles of relatively the same size and/or shape.

In other embodiments, the population of the nanoparticles is a blend of two or more different populations, each of which having nanoparticles of different sizes (or size distributions) and/or shapes.

For certain applications it may be desirable to vary not only the size and shape of the nanoparticles, making up the population, but also the chemical composition of the nanoparticles and/or the arrangement of the semiconductor AQCs and metal/metal alloy regions along the nanoparticles. Thus, in some embodiments, the population of nanoparticles is a blend of one or more of the following types/groups of nanoparticles:
1) nanoparticles of a certain pre-determined size distribution;
2) nanoparticles of a certain pre-determined shape;
3) nanoparticles having one metal/metal alloy region and one semiconductor region (optionally having one or more sub-region of different semiconducting materials);
4) nanoparticles having at least two metal/metal alloy regions and a single semiconductor region (optionally having one or more sub-regions of different semiconducting AQCs);
5) nanoparticles having one metal/metal alloy region and at least two semiconductor regions (optionally having each one or more sub-region of different semiconducting AQCs);
6) nanoparticles having at least two metal/metal alloy regions and at least two semiconductor regions (optionally having one or more sub-region of different semiconducting AQCs),
7) nanoparticles having at least two metal/metal alloy regions and at least two semiconductor regions (optionally having one or more sub-region of different semiconducting AQCs), wherein the arrangement (sequence) of regions or subregions along the nanostructure differs from one population to another;
8) nanoparticles which do not undergo photoactivation as described herein.

The population of nanoparticles may be attained by mixing together one or more of the above types of nanoparticles. Alternatively, heterogeneous populations may be prepared by employing, e.g. non-stoichiometric amounts of starting materials. Each group of nanoparticles may be manufactured separately and stored for future use. As a person skilled in the art would realize, each of the above groups of nanoparticles may be prepared in a substantially uniform or homogenous fashion. However, due to random defects having to do with e.g., the manufacture process, purity of starting materials and other factors, a certain degree of nanoparticles having defects in size, shape, chemical composition, and other parameters, may be found in each of these types of nanoparticles. It should be noted that the presence of such defects does not necessarily reflect on any one of the herein disclosed characteristics and in particular on their photocatalytic activity.

In order to achieve photocatalysis, the nanoparticles of the invention are contacted with at least one charge carrier acceptor, e.g. a redox couple, electrode or electrode/redox couple, under appropriate conditions, where the redox couple usually accepts charges via collision in solution (e.g., liquid, gel, polymer, etc), whereas the contact to an electrode will be in film form or other self-assembled manner ensuring a good contact. When in contact with the charge carrier acceptor, the medium containing the nanoparticles and the at least one charge carrier acceptor are irradiated with light in the ultraviolet/visible/near infrared range. As the nanoparticles of the invention comprise at least one type or preferably a mixture of different types of semiconducting AQCs, having an absorption onset in the ultraviolet to near IR range, so as charge separation at the semiconductor surface, i.e. at the metal-semiconductor interface, upon irradiating may ensue, the irradiation is preferably with a visible or near infrared light. Such light is abundant in solar illumination, so the most energy-saving and green illumination can be provided directly with solar light with its typical broad spectrum.

The nanoparticles of the invention are in some embodiments capable of retention of charge and can then transfer their electron to an electron acceptor, e.g., in a redox reaction, in the absence of continuous irradiation. In other words, the nanoparticles of the invention may be pre-irradiated, namely irradiated in the presence of hole acceptors creating an excess of charge in the system. This excess charge can be retained for a significant period of time. When the charged nanoparticles of the invention are brought into contact with the charge carrier acceptor of the second type, a reduction of the acceptor molecule may occur in the absence of UV, visible or NIR light and even in the dark.

It is therefore possible to use the nanoparticles of the invention in one or a combination of the following methods of photocatalysis:
1) direct photocatalysis, namely the simultaneous irradiation of a medium containing nanoparticle(s) of the invention and the charge carrier acceptor and donor, as detailed herein, to perform redox reactions directly, and/or 2) employing pre-irradiated nanoparticles of the invention (irradiated by intentional exposure to light in the presence of one type of charge carrier acceptor and absence of the opposite charge carrier acceptor and thus exhibiting retention of charge) in contact with the charge carrier acceptors in the absence of light (or at least not necessitating further light irradiation).

These methods may be utilized in the constructions of devices such as photoelectrochemical cells and photovoltaic cells, employing the general methods of the invention.

Thus, the present invention also provides in another of its aspects a method of photo-inducing charge separation and transfer of charge carriers to charge acceptors, said method comprising:

providing at least one type of nanoparticles, as disclosed herein;

contacting or mixing together said at least one type of nanoparticles with at least one type of electron acceptor and at least one type of electron donor in a medium; and optionally, irradiating the medium containing said at least one nanoparticle, at least one electron acceptor and at least one electron donor with a radiation in the UV, visible and/or near IR range, thereby allowing the formation an electron-hole pair in the AQCs surface, i.e. metal/semiconductor interface, of said at least one type of nanoparticles and subsequent charge separation and transfer of the electron and hole to said at least one type of electron acceptor and said at least one type of electron donor, respectively.

It is understood that the irradiating step of the mixture it is optional because the nanoparticles of the invention might be pre-irradiated, i.e. irradiated in the presence of hole acceptors creating an excess of charge in the system, as described above. If there is no pre-irradiation, it is necessary that the irradiating step of the composition containing the nanoparticles, the at least one type of electron acceptor and the at least one electron donor, is performed.

This method allows the creation of an electron-hole pair, in the presence of light (UV, visible and/or near infrared), and the separation of the electron-hole pair (also termed herein "charge carrier", a charge carrier is an electron and another charge carrier is a hole) in the nanoparticle(s) into charges, which transfer to the respective acceptor moieties: the electron to an electron acceptor (herein referred to as an "electron acceptor" or "electron scavenger") and the hole to hole acceptor (herein referred to as an "electron donor" or "hole acceptor" or "hole scavenger").

The electron acceptor molecule is selected in a non-limiting manner amongst acceptor dyes, such as methylene blue, azure B and thionine; oxygen ($O_2$); nitrates($NO_3^-$); hydrogen carbonate ($HCO_3^-$); phosphates ($PO_4^{3-}$); iron (III) compounds; manganese (IV) compounds; sulfates ($SO_4^{2-}$); carbon dioxide; chloride ion ($Cl^-$) and chlorinated compounds such as tetrachloroethylene (PCE), trichloroethylene (TCE), dichloroethene (DCE), and vinyl chloride (VC); water; alcohols such as methanol and ethanol and any other oxidizing molecule, where the LUMO (lowest unoccupied molecular orbital) of the molecule is lower than the Fermi level of the hybrid metal-AQC nanostructure.

The electron donor molecule, as described above, is selected in a non-limiting fashion amongst alcohols such as methanol, ethanol, propanol, glicerol, vinylalcohol, polyvinylalcohol; water; $S^{2-}$ as provided from for example, $Na_2S$, $Se^{2-}$ ions as provided from for example $Na_2Se$; $SO_3^{2-}$ ions as provided from for example $Na_2SO_3$; $SeO_3^{2-}$ ions as provided from for example $Na_2SeO_3$; complexes such as EDTA; benzene; iodide salts; alquilammonium salts, such as propylammonium nitrate, or tetralkylamonium salts such as tetrabuthylamonium bromide; alcohol amines such as triethanol amine; organic acids such as acetic acid, salicylic acid; or any other reducing molecules where the HOMO (highest occupied molecular orbital) of the molecule is higher than the Fermi level of the hybrid metal-AQC nanostructure.

The transfer of the electron and hole to their respective acceptors results in the reduction of the electron acceptor molecule and the oxidation of the electron donor molecule, allowing chemical transformations to take place at either the acceptor or donor molecules, and other applicable advantages. The reduction and oxidation reactions may be employed for the simultaneous reduction and oxidation of at least two organic or inorganic compounds which reduction-oxidation is sought or of the reduction or oxidation of at least one such compound in the presence of a sacrificial additive that undergoes the other of reduction and oxidation.

The present invention thus provides in another of its aspects a method for reducing at least one first organic or inorganic compound and/or oxidation of at least one second organic or inorganic compound, said method comprising:

providing at least one type of nanoparticles of the invention, as disclosed herein;

contacting or mixing together said at least one type of nanoparticles of the invention with said at least one first organic or inorganic compound (being the electron acceptor) and at least one second organic or inorganic compound (being the electron donor) in a medium; and optionally, irradiating the medium (containing said at least one type of nanoparticles of the invention, and at least one first and second organic or inorganic compounds) with a radiation in the UV, visible and/or near IR range; thereby allowing reduction of said at least one first organic or inorganic compound and/or oxidation of said at least one second organic or inorganic compound.

As stated above, the irradiating step of the mixture it is optional because the nanoparticles of the invention might be pre-irradiated. If there is no pre-irradiation, it is necessary to perform the irradiating step of the composition containing the nanoparticles, the at least one type of electron acceptor and the at least one electron donor.

Additionally, there is provided a method of degrading at least one contaminant from a solvent, for example water, or air, said method comprising:

introducing into a medium containing at least one contaminant at least one nanoparticle of the invention as defined;

irradiating said medium with light in the UV, visible and/or near IR range, thereby causing reduction or oxidation of said at least one contaminant.

In one embodiment the contaminant is an organic or inorganic compound. In another embodiment the solvent is an organic solvent or an aqueous solvent, i.e. a solvent that comprises water. In another embodiment the solvent is water.

For the transfer of each of electron and hole to their respective acceptors, the nanoparticles of the invention, aggregates of them or any other population thereof must be in contact with the electron and hole acceptor compounds in the medium. Within the context of the present invention, the term "contacting" or any lingual variation thereof refers to the mixing together or bringing together of said at least one acceptor compound and said at least one nanoparticle to allow charge transfer between said at least one nanoparticle and said at least one acceptor compound, thereby ensuing reduction or oxidation of the acceptor compound (whether electron acceptor or hole acceptor). The contact between the one or more nanoparticles and one or more of the acceptor compounds may with the acceptor compounds being dissolved in a solution and the nanoparticles constructed as part of an electrode (with or without bias), embedded in a matrix, deposited as mono- or multilayered films and/or freely distributed in a medium. For some applications, the acceptor compounds and the nanoparticles are in the same physical or chemical environment, namely embedded in a matrix, deposited as layers, etc. The terms "contacting", "mixing together" or "bringing together" do not necessarily mean that there is a physical contact among the at least one metal nanoparticle, the at least one electron acceptor and the at least one electron donor.

In other embodiments, the method is carried out under sunlight regardless of the nanoparticles population employed and the chemical transformation to be achieved.

As may be understood to one versed in the art from the disclosure provided herein, the nanoparticles of the invention may be used as photocatalysts in a variety of photoinduced chemical transformations. There are several advantages for using the nanoparticles of the invention as photocatalysts over previous technologies.

First, the population of nanoparticles may be tailored by choosing the AQC to time its band gap and band-offsets as required for the particular photoinduced process. Quantum confinement effects can be used by tuning the size of the semiconductor region so as to shift the gap and the band positions to match specific photocatalytic processes. This allows wide spectral coverage to efficiently harness solar energy, and allows for tuning the band offsets between the AQC, the metal (or metal alloy), and the redox couple. Moreover, heterostructured nanoparticles and nanorods can be prepared, which already provide a useful energy landscape for charge separation and limit competing recombination processes.

Second, the metal/metal alloy may be chosen and used to enhance catalytic activity, tune the energy level positions and enable photo-induced processes.

Third, the nanoparticles of the invention have a high surface area presenting many reaction centers, thus potentially increasing their efficiency.

Fourth, the nanoparticles of the invention are chemically accessible and through surface manipulations and ligand exchange, can be solubilized in organic or polar solutions including water, deposited as mono- or multi-layered films, preferably transparent films, or bound to surfaces on, e.g., electrodes, providing wide flexibility in their applications in photocatalysis and the other applications discussed above.

The type of the photocatalysis reaction employing the nanoparticles of the invention depends on the type of nanoparticles or nanoparticle population (homogenous/heterogeneous) and the redox couple used. The energy band alignment of the semiconductor's conduction and valence bands and the metal's Fermi energy will determine a specific window of redox couples that may be used.

In some embodiments, the methods of the invention are used as a method of photocatalysis for the generation of hydrogen gas in a water splitting process. In such embodiments, the method of the invention may be carried out in a photoelectrochemical cell and the charge carrier acceptors are in the form of an electrode and a redox couple.

In further embodiments, the method of the invention is used for photo-voltage production; employing, in certain embodiments, a charge carrier in the form of an electrode. In such embodiments, the method may be carried out in a solar cell device.

In further embodiments, the method of the invention is used for the production of electric currents in a circuit or for producing electric energy that may be, e.g. stored in a battery. In such embodiments, the method of the invention may be carried out in a photoelectrochemical cell and the charge carrier acceptors are in the form of an electrode and a redox couple.

The present invention, thus, further provides, in another of its aspects, a device comprising at least one type of nanoparticles according to the present invention. Non-limiting examples of such a device are a solar cell, a photoelectrochemical solar cell, a device for photochemical treatment of contaminants and a device for photocatalysis of chemical reactions. The devices may be used as single cells or as arrays thereof. The device of the invention may comprise a population of nanoparticles as defined herein.

The photoelectrochemical cells may be used for the photoelectrical-induction of chemical reactions. Such a cell may be utilized for the photoelectrical-induction of contaminant degradation, reduction and/or oxidation of one or more organic and/or inorganic compounds, water-splitting in the presence or absence of at least one sacrificial compound and other chemical transformations.

In another embodiment, the device of the invention is a photovoltaic cell including in one particular construction two electrodes with a self-assembled layer of hybrid nanoparticles placed between the two electrodes so that the different regions of each of the nanoparticles of the layer are in contact with the different electrodes, i.e., metal/metal alloy region to one electrode and semiconductor region to the other electrode. Following light absorption, charge separation ensues following the sequence of events disclosed herein, creating a current between the two electrodes.

All the technical and scientific terms throughout the present invention have the same meaning as that commonly understood by a person skilled in the art to which the invention belongs. Throughout the description and claims, the word "comprises" and its variants do not exclude other technical features, components or stages. For the person skilled in the art, other objects, advantages and characteristics of the invention will be inferred in part from the description and in part from putting the invention into practice. As used herein, the terms "about" and "approximately" mean a slight variation of the value specified, preferably within 10 percent of the value specified. Nevertheless, the terms "about" and "approximately" can mean a higher tolerance of variation depending on for instance the experimental technique used. Said variations of a specified value are understood by the skilled person and are within the context of the present invention. Further, to provide a more concise description, some of the quantitative expressions given herein are not qualified with the terms "about" and "approximately". It is understood that, whether the terms "about" and "approximately" are used explicitly or not, every quantity given herein is meant to refer to the actual given value, and it is also meant to refer to the approximation to such given value that would reasonably be inferred based on the ordinary skill in the art, including equivalents and approximations due to the experimental and/or measurement conditions for such given value.

The following examples and the drawings illustrate the scope of the invention and do not intend to be limiting.

EXAMPLES

Example 1

Photodissolution of Gold Nanorods a) Preparation of Au Nanorods Containing Clusters:

Firstly, a seed solution was prepared as follows: 2.5 ml of 0.2 M CTAB (cetyltrimethylammonium bromide, $(C_{16}H_{33})N(CH_3)_3Br$) solution was mixed with 2.5 ml of $5 \times 10^{-4}$ M $HAuCl_4$. To the stirred solution, 30 µl of ice-cold 0.1M $NaBH_4$ was added, which results in the formation of a solution with brownish yellow color. Vigorous stirring of the seed solution was continued for 2 minutes. We then used this seed solution 10 minutes after the addition of the reducing agent. Then, a growth solution was prepared as follows: 0.1 ml of $4 \times 10^{-3}$ M $AgNO_3$ solution was added to 2.5 ml of 0.2 M CTAB. To this solution, 2.5 ml of $10^{-3}$ M $HAuCl_4$ was added and, after gentle mixing of the solution, 35 µl of 0.0788 M ascorbic acid was added. Ascorbic acid, as a reducing agent, changes the growth solution from dark yellow to colorless within 10 minutes. The final step was the addition of the seed solution to the growth solution. The color of the solution gradually changed within 10-20 minutes. A TEM microscopy image of the rods can be seen in FIG. 2, a). The rods obtained have an aspect ratio (length/diameter) of 3.7.

b) Effect of UV-Light Irradiation on Gold Nanorods

Figure 2:
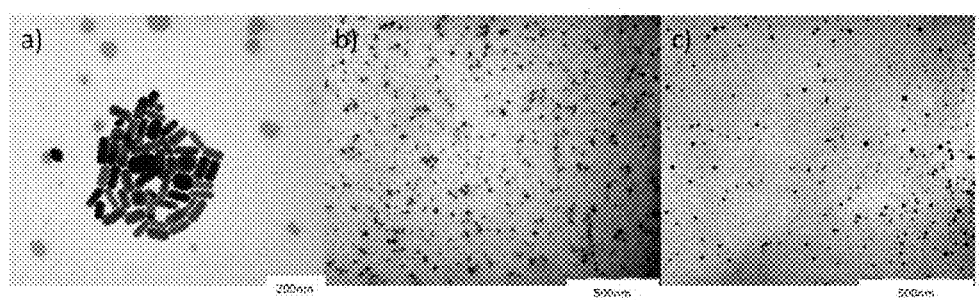
FIG. 2. TEM-images of (a) the initial gold nanorods; (b) after UV-irradiation during 23 h and (C) after UV-irradiation during 28 h.
Figure 3:
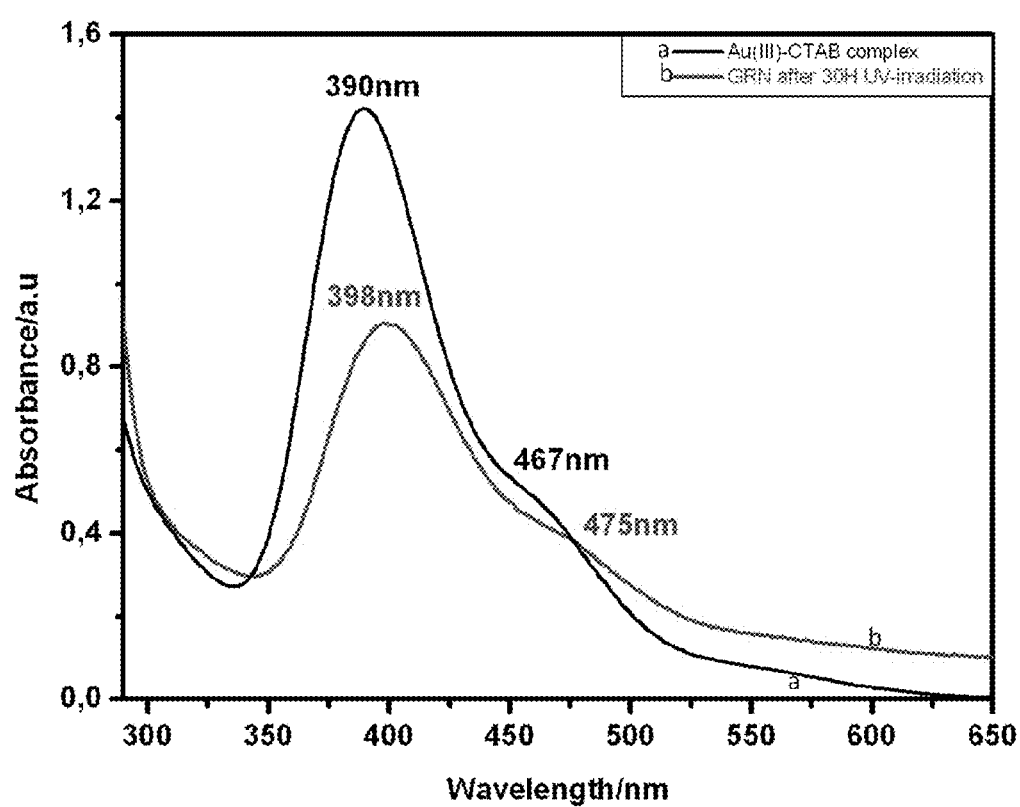
FIG. 3. Absorption spectra of the: (a) growth solution of Au nanorods before the addition of ascorbic acid for the productions of nanorods, containing 0.5 mM Au(III)-CTAB complex, and the (b) solution of Au nanorods (GNR) (a.r≈3.7 at pH 3.9) after 30 hours of UV-irradiation.

The effect of the irradiation of a solution of the gold nanorods prepared as it was explained in example 1a) was carried out by exposure 3 ml of the colloidal solution of the nanoparticles, which were put in a quartz cuvette (maintained at a constant temperature of 28° C.), to different irradiation times to a UV light source (254 nm). FIG. 1 shows the absorption spectra of the solution before and after irradiation by UV-light at different times. It can be observed that the optical density at both, the longitudinal and transverse plasmon bands (located at 800 nm and 520 nm, respectively) decreases with increasing the irradiation time. The absorption maxima of the longitudinal plasmon band are gradually shifted to shorter wavelengths indicating that there is a decrease of the length of the nanorods forming spheres. By increasing the irradiation time, it is observed the complete disappearance of the plasmon bands, which indicates the total decomposition of the nanorods after 24 h. It is observed that a new band at 398 nm with a small shoulder at 475 nm starts to grow from 23 hours to 30 hours. This band is totally similar to the band displayed by the Au(III)-CTAB complex (see FIG. 3), which is formed in the growth solution used for the synthesis of gold nanorods before adding the reducing agent (ascorbic acid). This means that Au nanorods are not only reshaped, but they are totally oxidized. FIGS. 2, b) and c) show a TEM picture of the dissolved NRs after irradiation for 22 h and 28 h, respectively. As it is shown, the nanorods (NRs) have completely disappeared and only some nanospheres remain (which are detected in the UV-vis spectra by a small band located at 520 nm). It can be also seen that the number of spherical particles decreases with time showing that spherical particles also dissolve with time.

Example 2

Stability of Clusters Against Irradiation

Figure 4:
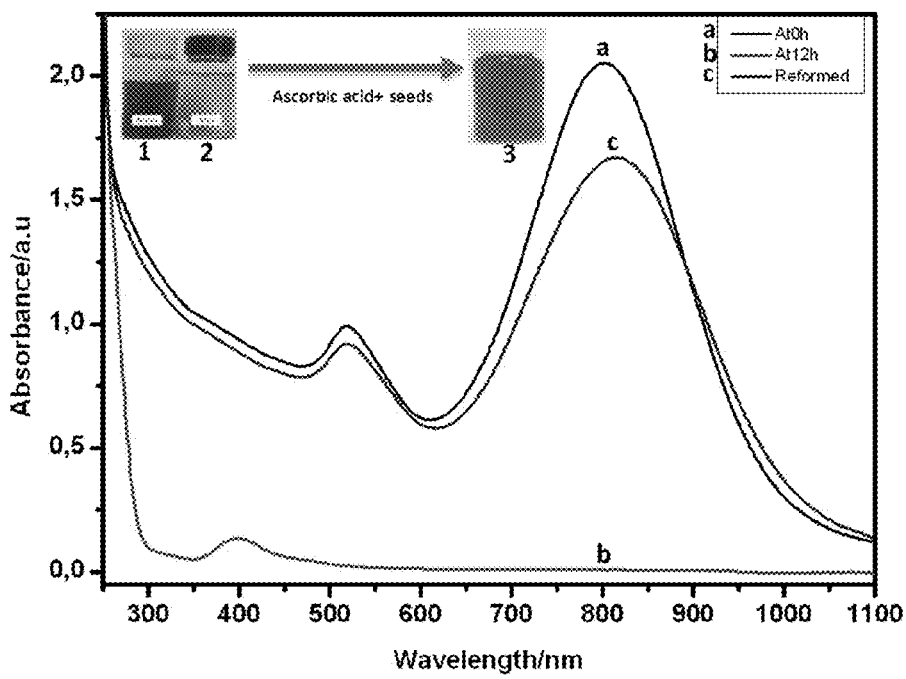
FIG. 4. Absorption spectra showing the dissolution of gold nanorods (a.r≈3.7 at pH pH=3.9) with stirring (a), irradiating the sample with UV-light during ~12 h (b), and the reformed NRs after addition of ascorbic acid & seeds solution (c). The including pictures show the difference in color between before (1) and after (2) UV irradiation (left picture), and after addition of ascorbic acid and seeds solution (right picture) (3).

Contrary to what happens with many semiconductors, which are dissolved by photocorrosion after being irradiated for some periods of time, the semiconductor Ag clusters remain active after complete dissolution of the metal gold NRs, as it can be shown in FIG. 4, which shows that, after the dissolution of a sample of Au NRs, (as it was indicated in Example 1b), just adding new reactants (ascorbic acid and seeds), without Ag salt—which was used to form the Ag clusters catalyzing the formation of Au NRs before irradiation-, to the final sample obtained after irradiation, the re-formation of Au NRs is observed.

Example 3

Inhibition of Photocorrosion by Pre-Heating the Au NRs Samples

To further show that clusters are responsible for the photocorrosion of the Au NRs, an experiment was done just heating the solution of gold NRs prepared according to the Example 1a) at high temperatures. As it was shown in the patent application WO 2011/064430, unsupported AQCs fuse at temperatures in the range of 120-150° C. Therefore, if gold NRs are heated at those temperatures, the Ag semiconductor clusters should fuse forming Ag metal nanoparticles, and the photocorrosion should be inhibited. To check this, a sample of Au NRs was pre-heated at 130° C. during 10 minutes before irradiation. As it can be seen in FIG. 5 (sample 2), the colour of the initial sample changes to pink, characteristic of the formation of gold nanospheres, whereas the sample without pre-heating was totally dissolved. Therefore, the experiment shows that photocorrosion was inhibited, although the heating treatment was not enough to eliminate all the clusters. One can completely eliminate the clusters by increasing the preheating time. For this purpose a similar sample of Au nanorods was pre-heated at 130° C. during 2 hrs. As it can be observed in FIG. 9A, now the dissolution is completely inhibited as it can be observed by the inhibition of the decrease of the plasmon bands (actually there is a small increase—not decrease—of the absorbance, which is due to the evaporation of a small amount of solvent during the long irradiation time (40 hrs)). This confirms again that the presence of low-temperature melting semiconductor clusters are needed for the photocorrosion of Au NRs.

Example 4

Inhibition of Photocorrosion by Hole Scavengers

Figure 5:
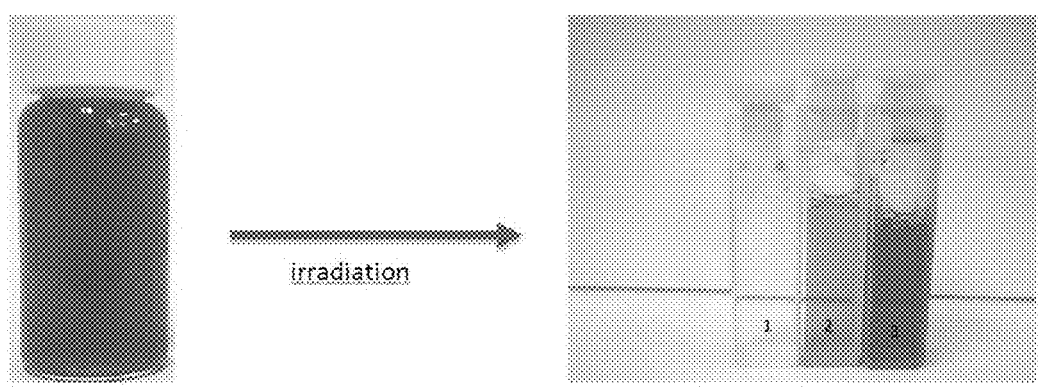
FIG. 5. Pictures showing the difference between the initial sample of gold nanorods (a.r≈3.7 at pH 3.9) (left picture) and (1) the sample after UV-irradiation during 30 hours with a pale yellow color of Au (III)-CTAB complex formed after complete photocorrosion of the gold nanorods; (2) a sample of gold nanorods previously heated 1 hour at 130° C. and then irradiated with UV-light during 30 hours, with a pink color characteristic of the formation of gold nanospheres; and (3) a sample of gold nanorods with ethanol irradiated with UV-light during 30 h, without almost any change in the color of the original solution.

The irradiation of Au NRs prepared according to the Example 1a) was carried out in the presence of ethanol. FIG. 5, sample 3, shows that the colour of the sample remains similar to the original one after irradiation the sample for 30 h, confirming the complete inhibition of the dissolution of the Au metal by the hole scavenger. This process can be seen in the scheme of FIG. 8, which shows that when ethanol is present in the system, the holes generated by the irradiation of the sample are used to oxidize the ethanol rather than the gold atoms of the NRs, because of the lower redox potential of ethanol (approximately 0V RHE) than Au (0.85V RHE for the formation $AuBr_4^-$).

Example 5

$O_2$ Production Irradiating at Basic pHs

Figure 6:
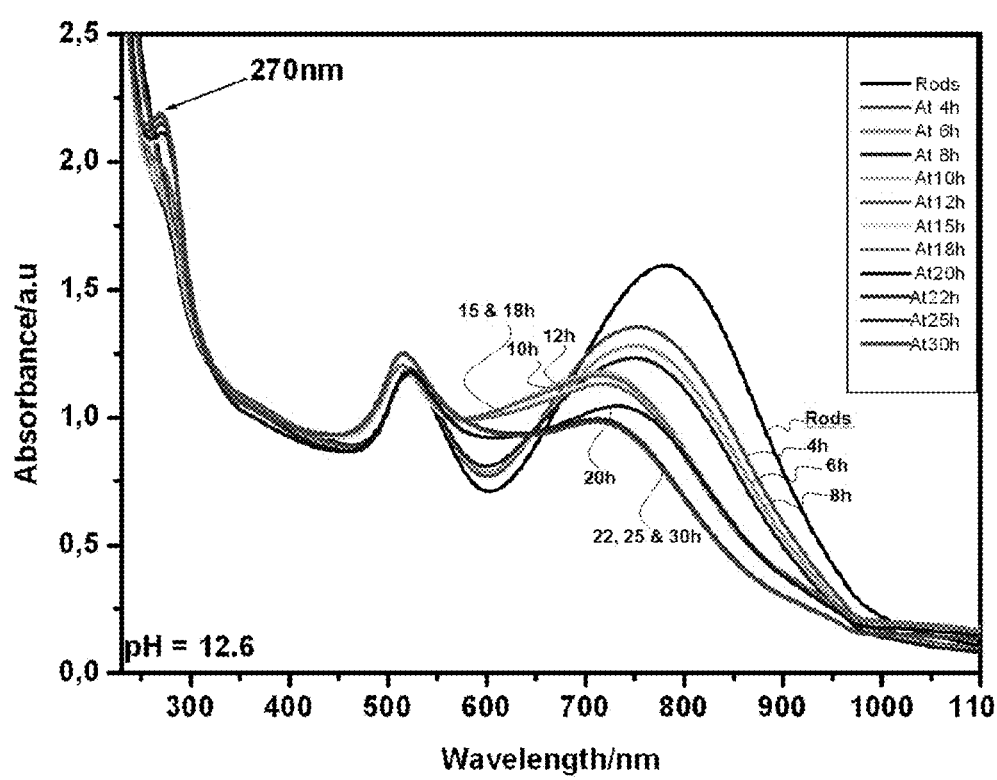
FIG. 6. Absorption spectra showing the changes of gold nanorods (a.r≈3.7 at pH 12.6) after irradiation with UV-light for 0, 4, 6, 8, 10, 12, 15, 18, 20, 22, 25 and 30 hours.

The highly oxidant holes produced by irradiation of gold nanorod samples prepared as indicated in example 1a) can be used for the production of oxygen from water splitting in basic conditions. As it can be seen in the scheme of FIG. 8, the oxidation of OH⁻ to produce $O_2$ has a redox potential of 0.40V RHE, which is lower than the redox potential of Au. Therefore, the oxidation of OH⁻ is more favourable than the oxidation of Au, so that in basic conditions the dissolution of Au should be highly inhibited. As it can be seen in FIG. 6, even after 30 h of irradiation NRs do not decompose and only a small decrease of the length of the NRs is observed by the blue shift of the longitudinal plasmon band.

The highly oxidant holes produced by irradiation of the Au NRs with AQCs could then be used in the same way to oxidize organic pollutants, which usually have redox potentials smaller than 0.5 V RHE.

Example 6

Figure 7A:
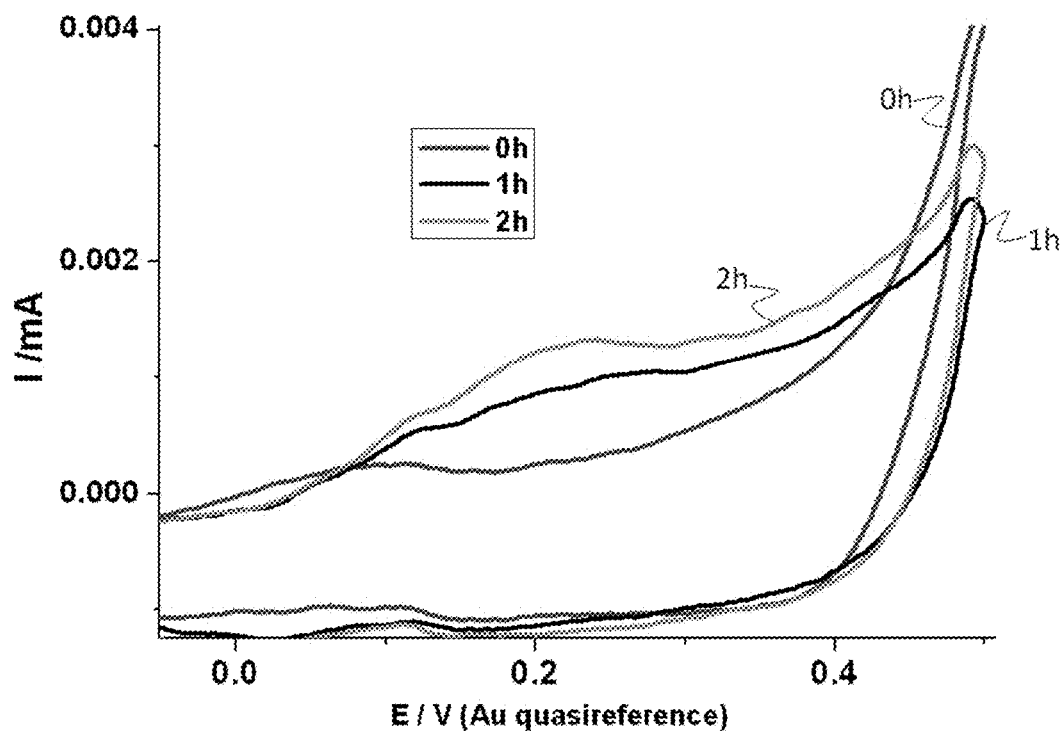
FIG. 7: A) Cyclic voltammogram of a solution of Au NRs (a.r≈3.7 at pH 3.9) under $N_2$ atmosphere irradiated during 1 h (black curve) and 2 h (green curve), showing that the peak at around 0.2V (Au quasi-reference) appears after irradiation of the sample. B) Blank of a solution of $HClO_4$ 0.1 M in a saturated atmosphere of hydrogen showing the peak of the hydrogen oxidation at around 0.2V (Au quasi-reference). C) Picture of the cell containing the solution clearly showing the produced hydrogen bubbles after irradiation.
Figure 7B:
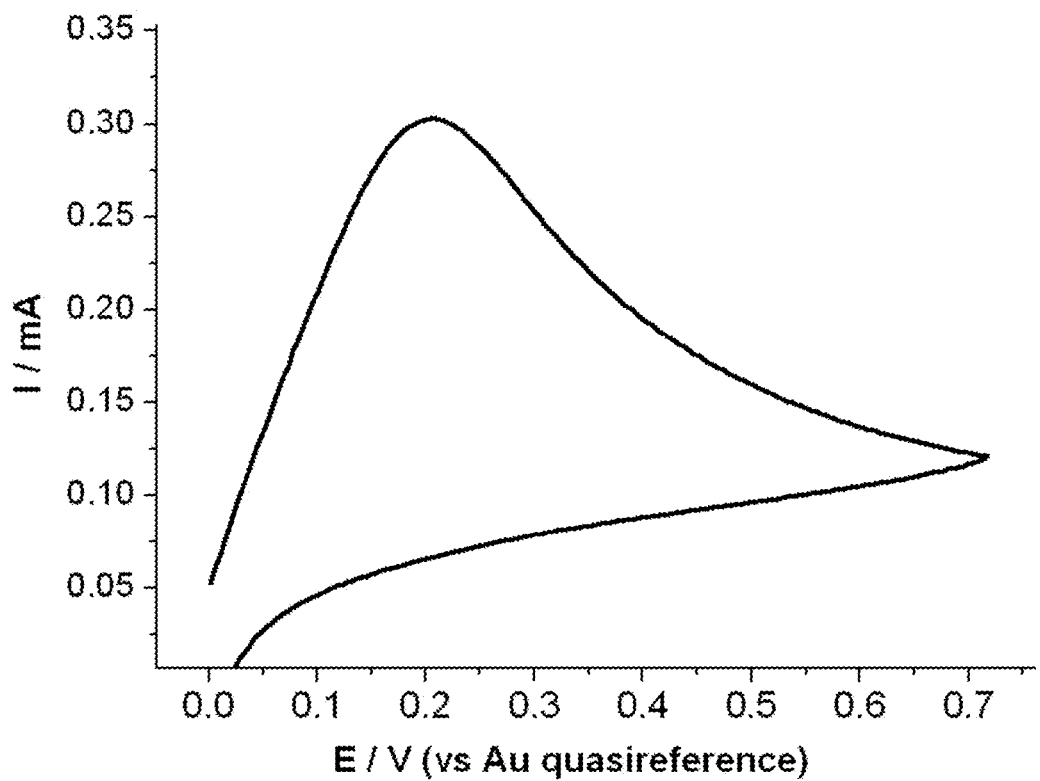
Figure 7C:
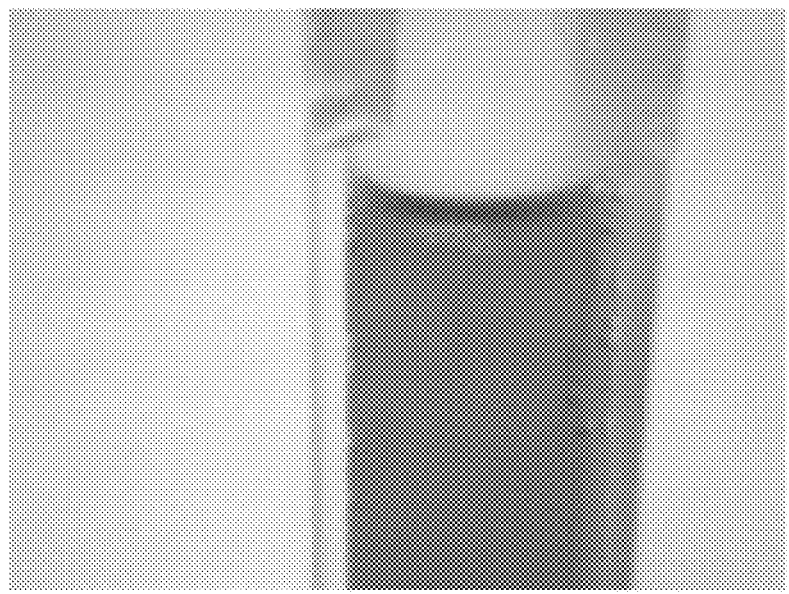
Figure 8:
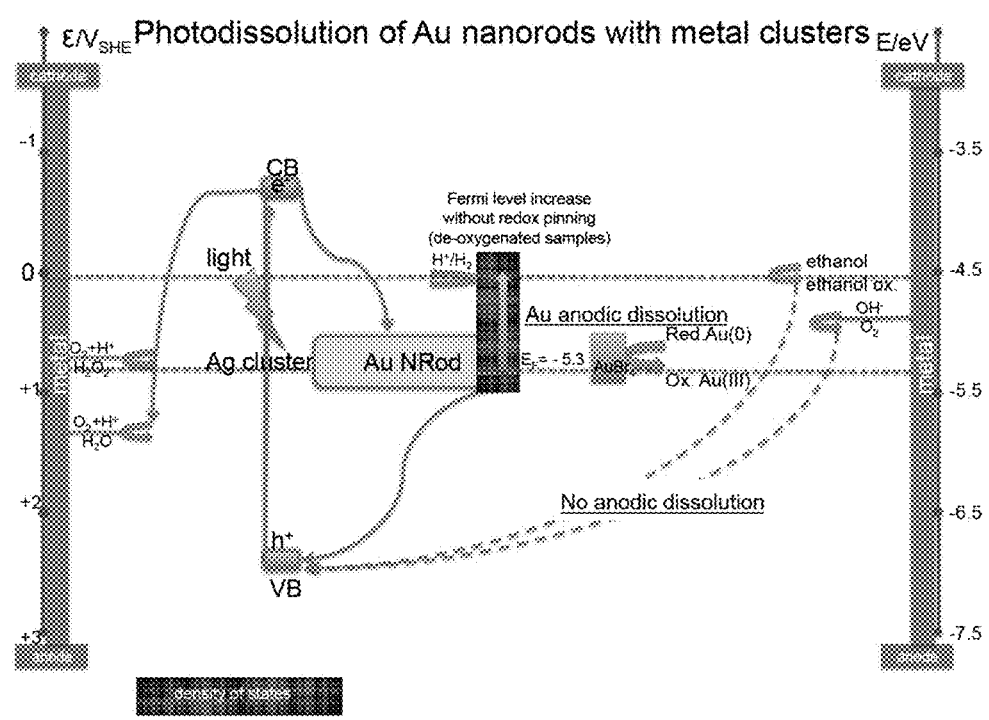
FIG. 8. Scheme of photodissolution of Au nanorods with metal clusters; CB represents the covalent band; VB represents the valence band; $e^-$ represents an electron; $h^+$ represents a hole; ε represents photocurrent; E represents electrical current; SHE represents Standard Hydrogen Electrode; and $E_F$=Fermi level.

$H_2$ Production by Irradiation in the Presence of Hole Scavengers without Electron Scavengers The system of Au NRs with clusters could also be used for the production of $H_2$ from water splitting in acid conditions. For this purpose, a hole scavenger have to be used and the system has to be free from any electron scavengers, like $O_2$, $Cl^-$, $SO_4^{2-}$, $NO_3^-$, $HCO_3^-$, $PO_4^{3-}$ etc. In such case, electrons can be stored in the metal NRs increasing their Fermi level and producing the cathodic polarization of NRs. After sometime of irradiation, the Fermi level can reach 0V RHE (corresponding to a cathodic polarization of circa 0.8V) and the reduction of $H^+$ to $H_2$ can start (as shown in the scheme of FIG. 8). To check this, an experiment was carried out in the presence of ethanol as hole scavenger in deoxygenated samples and inert atmosphere. The presence of $H_2$ was electrochemically detected as it can be seen in FIG. 7A, which shows the characteristic oxidation peak of $H_2$ (FIG. 7B shows a blank using $HClO_4$ 0.1 M in a saturated $H_2$ solution using a Au quasi-reference electrode and Pt as working and counterelectrode) at circa 0.2V (Au quasi-reference). This peak is already clearly observed after 1 h of irradiation. A picture of the hydrogen bubbles coming from the solution after 1 hour of irradiation can be seen in FIG. 7C.

Example 7

Effect of UV-Light Irradiation on Preheated Gold Nanorods in the Presence of Added Ag Clusters In order to show that clusters (AQCs) can be added after the synthesis of gold nanorods (which do not comprise AQCs attached to them), a sample of gold nanorods was pre-heated, as it was indicated in Example 3, during 2 hours. As it was shown in Example 3 this heating time is enough to eliminate (fuse) all the clusters present in the Au NRs solution. Then, a commercial solution of Ag clusters from NANOGAP (Reference NGAP AQC Ag-1102-W, mainly composed of $Ag_2$, $Ag_3$ and $Ag_4$ clusters dispersed in water with a concentration of 0.5 mg/L) was added to this pre-heated gold NRs solution, so that the final concentration of clusters in the NRs solution was 3 nM. As it can be seen in FIG. 9B, the irradiation of this sample, contrary to the sample without Ag clusters (Ag AQCs), which does not show any dissolution even after 40 hrs (as it was indicated in the example 3), dissolves the Au NRods and transforms them to spheres in approximately 6 hours.

Example 8

Figure 10:
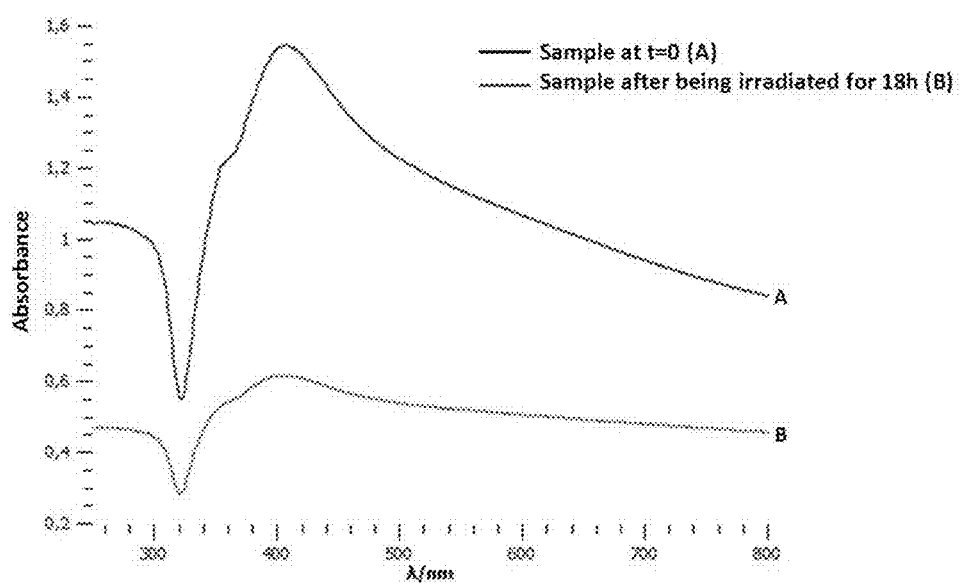
FIG. 10 shows UV-vis spectra of a silver nanofibers solution before irradiation (A) and after 18 hours of UV irradiation (B). A 50% decrease in the 406 nm absorption band is shown, corresponding to the plasmonic band of silver, after 18 h exposure to the UV light source (Example 8).

Photodissolution of Silver Nanofibres Containing Ac AQCs a) Synthesis of Ag Nanofibers Containing Ag AQCs 1 L of water at 25° C. is introduced into a 10 L glass container with mechanical stirring. 30 mL of an Ag cluster solution, Ag AQCs mainly of between 2 to 5 atoms, $Ag_2$-$Ag_5$, with a concentration of 10 mg/L are then added. 3.5 g of ascorbic acid are subsequently introduced under stirring and after 5 minutes 4 L of water are added. Finally, 3.4 g of silver nitrate are added under strong stirring. The reaction is constantly stirred for 4 hours. The Ag nanofibers are obtained as a precipitate which is dispersed again by stirring.

b) Effect of UV-Light Irradiation on Silver Nanofibers Containing Ag Clusters:

A quartz cuvette was filled and sealed with a diluted (1:1000) dispersion of silver nanofibers prepared as described in 8a). Before the irradiation, an intense absorption band at 406 nm reveals the presence of silver nanofibers. For irradiating the sample, a UV light source (maximum intensity at 254 nm) was set parallel to the cuvette walls at 10 cm of distance from the radiating surface. At given time periods, UV-Vis spectra were taken. Temperature (30° C.) was kept constant during the experiment. It was observed that after 18 hours of exposure to UV radiation, there is ≈⅓ decrease of the initial absorption band at 406 nm, as it can be seen in FIG. 10 indicating the photodissolution of the Ag nanofibers.

Example 9

Photodissolution of Gold Nanotriangles Catalyzed by Ag Clusters a) Preparation of Au Nanotriangles with Ag Clusters.

Figure 11:
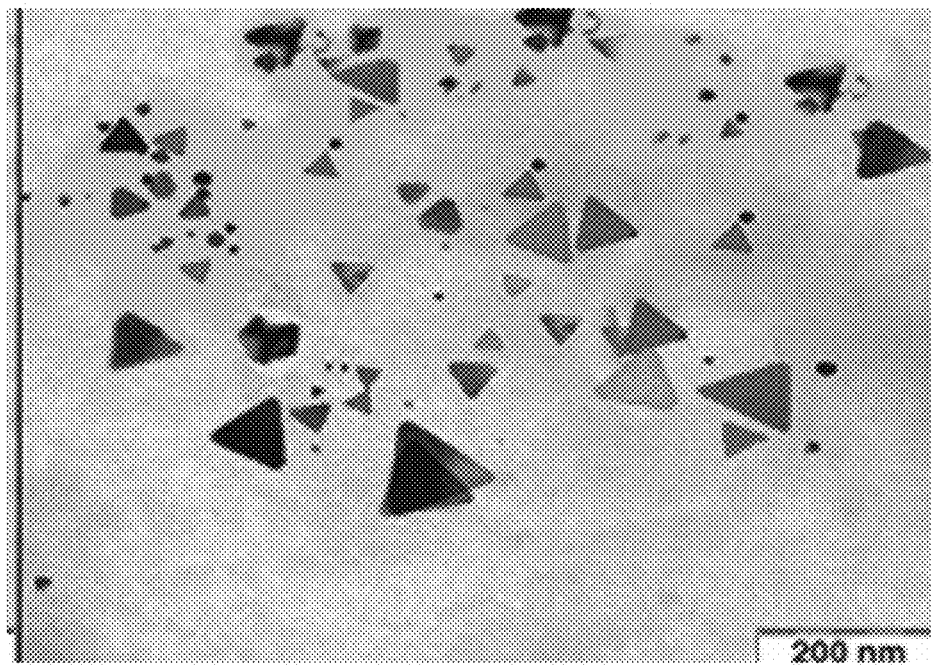
FIG. 11 shows a Transmission Electron Microscope image of nanotriangles synthesized by the method described in Example 9.

By a similar procedure to the one described in example 1, changing only the concentration of Ag clusters, i.e. the ratio R, which is now adjusted to 3, leads to almost exclusively the formation of triangular nanoparticles. A TEM microscopy image of the nanotriangles obtained by this procedure can be seen in FIG. 11.

b) Effect of UV-Light Irradiation on Gold Nanotriangles with Ag Clusters

Figure 12:
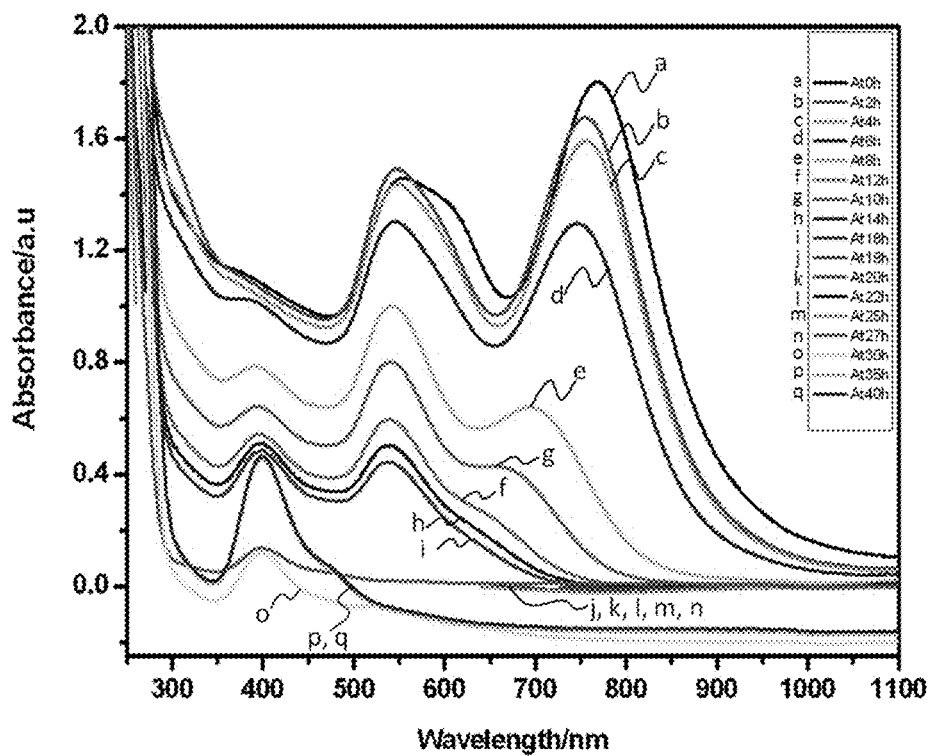
FIG. 12 are spectra showing the effect of the UV light on a solution of gold nanotriangles with Ag clusters of Example 9. After irradiation it can be observed the progressive transformation of the nanotriangles into nanorods, and finally the dissolution of the rods, similarly to example 1, with the appearance of a peak at 398 nm corresponding to the Au ions.

The effect of the irradiation of a solution of the gold nanotriangles, prepared as it was explained in example 9a) with Ag clusters, was carried out by exposure of 3 ml of the colloidal solution of the nanotriangles, which were put in a quartz cuvette (maintained at a constant temperature of 28° C.), to different irradiation times with a UV light source (254 nm), similarly as it was described in Example 1. FIG. 12 shows the absorption spectra of the solution before (t=0) and after irradiation with UV-light at different times. It can be seen that the three Plasmon bands (at ≈520 nm, ≈610 nm as a shoulder, and ≈800 nm), characteristics of nanotriangles, decrease with increasing the irradiation time. It is to notice that the first band to disappear corresponds to the shoulder at ≈650 nm indicating the transformation of the nanotriangles into nanorods. Once the nanotriangles are transformed by photodissolution into nanorods, then the photodissolution of the nanorods occurs similarly as it was shown in example 1.

Example 10

Photodissolution of Gold Nanorods Catalyzed by Cu AQCs a) Synthesis of Au Nanorodscatalyzed by Cu Clusters.

For this purpose, two solutions were first prepared: seed and growth solutions.

Seed Solution: An hexadecyltrimethylammonium bromide (CTAB) solution (2.5 ml, 0.20 M) was mixed with 2.5 ml of $5 \times 10^{-4}$ M $HAuCl_4$. To the stirred solution, 0.3 ml of ice-cold 0.01 M NaBH4 was added, which resulted in the formation of a brownish-yellow solution. Vigorous stirring of the seeds was continued for 2 minutes. After the solution was stirred, it was kept at 25° C.

Growth solution: a CTAB solution (2.5 ml, 0.20 M) was added to 0.5 µl of a 1 mg/L Cu-AQC solution (mainly composed by $Cu_5$) to have a final concentration of $3.3 \times 10^{-8}$ M at 25° C. To this solution, 2.5 ml of $10^{-3}$ M $HAuCl_4$ was added and, after gentle mixing of the solution, 35 µl of 0.0788 M ascorbic acid (freshly prepared) was added. Ascorbic acid changed the growth solution color from dark yellow to colorless.

Finally, 6 µl of the seed solution were added to the growth solution and the color of the mixed solution gradually changed within 2-10 minutes, showing the formation of gold nanorods.

b) Photodissolution of Gold Nanorods Catalyzed by Cu AQCs

Figure 13:
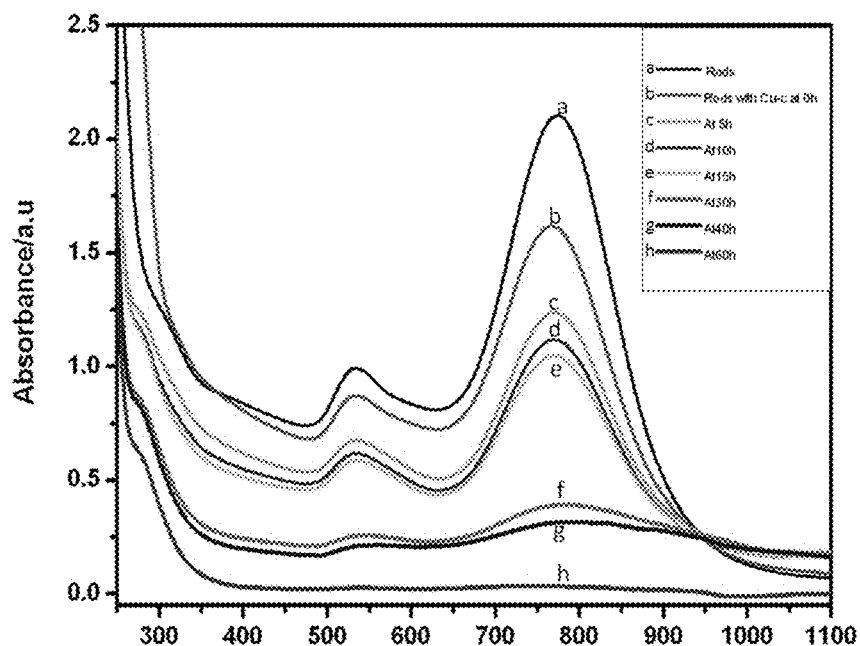
FIG. 13 are spectra showing the effect of visible light (20 W) on a solution of gold nanorods with Cu clusters.

The effect of the irradiation of a solution of the gold nanorods with Cu clusters, prepared as it was explained above (10a)), was carried out by exposure of 3 ml of the nanorods solution, which were put in a quartz cuvette (maintained at a constant temperature of 28° C.), to different irradiation times using a normal visible light source (20 W), at the same conditions of the example 1b). In FIG. 13, it can be seen that the plasmon bands disappear, indicating the photodissolution of the nanorods, similarly to what occurred in example 1 using Ag clusters.

The invention claimed is:

1. A photocatalytic method directed to the reduction or oxidation of at least one organic or inorganic compound, or to water splitting, said method comprising
   the step of contacting,
   as photocatalyst, at least one metal nanoparticle having at least one of its dimensions between 1 nm and 60 mm comprising at least one semiconductor attached to it,
   wherein the metal nanoparticles have shape of nanorods,
   wherein the at least one semiconductor is an atomic quantum cluster (AQC) consisting of between 2 and 55 zero-valent transition metal atoms, wherein the zero-valent transition metal atoms of the AQCs are selected from Ag, Au, Pt, Pd, Co, Cu, Fe, Cr, Ni, Rh and combinations thereof, and
   wherein the AQC and the metal nanoparticle have Fermi levels having a difference smaller than or equal to 1.5 eV at absolute zero,
   with at least one electron acceptor molecule wherein its LUMO (lowest unoccupied molecular orbital) is lower than the Fermi level of the at least one metal nanoparticle comprising at least one AQC; wherein said one electron acceptor molecule is selected from acceptor dyes, oxygen ($O_2$), nitrates($NO_3^-$), hydrogen carbonates ($HCO_3^-$), phosphates ($PO_4^{3-}$), iron (III) compounds, manganese (IV) compounds, sulfates ($SO_4^{2-}$), carbon dioxide, chloride ion ($Cl^-$) and chlorinated compounds, water, and alcohols; and
   at least one electron donor molecule wherein its HOMO (highest occupied molecular orbital) is higher than the Fermi level of the at least one metal nanoparticle comprising at least one AQC; wherein said one electron donor molecule is selected from alcohols, water, compounds comprising $S^{2-}$, $Se^{2-}$, $SO_3^{2-}$ or $SeO_3^{2-}$ ions, complexes such as EDTA, benzene, iodide salts, alkylammonium salts, alcohol amines, and organic acids;
   by obtaining a composition comprising the metal nanoparticle, the at least one electron acceptor, and the at least one electron donor; and
   (ii) irradiating said composition with a radiation in the ultraviolet to near infrared, provided that the nanoparticles have not been pre-irradiated, and
   the step of irradiating the medium containing said at least one metal nanoparticle comprising at least one AQC, at least one electron acceptor and at least one electron donor with a radiation comprised in the ultraviolet to the near IR range which results in a chemical reaction involving the reduction of the electron acceptor and the oxidation of the electron donor.

2. The method according to claim 1, wherein the zero-valent transition metal atoms of the AQCs are selected from Ag, Au, Pt, Pd and combinations thereof.

3. The method according to claim 1 wherein the metal of the metal nanoparticles is selected from Au, Ag, Co, Cu, Pt, Fe, Cr, Pd, Ni, Rh, Pb and combinations thereof.

4. The method according to claim 1 wherein the transition metal of the metal nanoparticles and the zero-valent transition metal atoms of the at least one atomic quantum cluster is the same.

5. The method according to claim 1 wherein the transition metal of the metal nanoparticles and the zero-valent transition metal atoms of the at least one atomic quantum cluster is different.

6. The method according to claim 1 wherein the atomic quantum cluster and the metal nanoparticles have Fermi levels at absolute zero, which its difference is not bigger than 1 eV.

7. The method according to claim 1, wherein the organic or inorganic compound is a contaminant present in the air or in a solvent.

8. The method according to claim 1, wherein the zero-valent transition metal atoms of the AQCs are Ag.

9. The method according to claim 1, wherein the metal of the metal nanoparticles is selected from Ag, Au, Pt, Pd and combinations thereof.

10. The method according to claim 1, wherein the metal of the metal nanoparticles is Au.

11. The method according to claim 1, wherein the atomic quantum cluster and the metal nanoparticles have Fermi levels at absolute zero, which its difference is not bigger than 500 meV.

12. The method according to claim 1, wherein the atomic quantum cluster and the metal nanoparticles have Fermi levels at absolute zero, which its difference is between 0 and 200 meV.

13. A photocatalyst composition comprising:
   a metal nanoparticle having at least one of its dimensions between 1 nm and 60 mm comprising at least one semiconductor attached to it,
   wherein the metal nanoparticles have shape of nanorods,
   wherein the at least one semiconductor is an atomic quantum cluster (AQC) consisting of between 2 and 55 zero-valent transition metal atoms, wherein the zero-valent transition metal atoms of the AQCs are selected from Ag, Au, Pt, Pd, Co, Cu, Fe, Cr, Ni, Rh and combinations thereof, and wherein the AQC and the metal nanoparticle have Fermi levels having a difference smaller than or equal to 1.5 eV at absolute zero, at least one electron acceptor molecule wherein its LUMO (lowest unoccupied molecular orbital) is lower than the Fermi level of the metal nanoparticle comprising at least one AQC; wherein said one electron acceptor molecule is selected from acceptor dyes, oxygen ($O_2$), nitrates ($NO_3^-$), hydrogen carbonates ($HCO_3^-$), phosphates ($PO_4^{3-}$), iron (III) compounds, manganese (IV) compounds, sulfates ($SO_4^{2-}$), carbon dioxide, chloride ion ($Cl^-$) and chlorinated compounds, water, and alcohols; and at least one electron donor molecule wherein its HOMO (highest occupied molecular orbital) is higher than the Fermi level of the metal nanoparticle comprising at least one AQC; wherein said one electron donor molecule is selected from alcohols, water, compounds comprising $S^{2-}$, $Se^{2-}$, $SO_3^{2-}$ or $SeO_3^{2-}$ ions, complexes such as EDTA, benzene, iodide salts, alkylammonium salts, alcohol amines, and organic acids.

14. The composition according to claim 13 in a medium selected from a liquid aqueous or non-aqueous medium, a gel, a polymer, an electrode or a surface medium, and wherein a plurality of said nanoparticles comprising atomic quantum clusters (AQC) is freely distributed in said medium.

15. A device for the photocatalysis of chemical reactions configured to comprise a medium containing nanoparticles having at least one of its dimensions between 1 nm and 60 mm comprising at least one semiconductor attached to it, wherein the metal nanoparticles have shape of nanorods, wherein the at least one semiconductor is an atomic quantum cluster (AQC) consisting of between 2 and 55 zero-valent transition metal atoms, wherein the zero-valent transition metal atoms of the AQCs are selected from Ag, Au, Pt, Pd, Co, Cu, Fe, Cr, Ni, Rh and combinations thereof, and wherein the AQC and the metal nanoparticle have Fermi levels having a difference smaller than or equal to 1.5 eV at absolute zero, placed in contact with at least one charge carrier acceptor selected from a redox couple, an electrode or an electrode/redox couple.

16. A photovoltaic cell configured to comprise two electrodes with a self-assembled layer of nanoparticles, placed between the two electrodes in a disposition so that the different regions of each of the nanoparticles of the layer are in contact with the different electrodes, said nanoparticles having at least one of its dimensions between 1 nm and 60 mm comprising at least one semiconductor attached to it, wherein the metal nanoparticles have shape of nanorods, wherein the at least one semiconductor is an atomic quantum cluster (AQC) consisting of between 2 and 55 zero-valent transition metal atoms, wherein the zero-valent transition metal atoms of the AQCs are selected from Ag, Au, Pt, Pd, Co, Cu, Fe, Cr, Ni, Rh and combinations thereof, and wherein the AQC and the metal nanoparticle have Fermi levels having a difference smaller than or equal to 1.5 eV at absolute zero.

* * * * *

UNITED STATES PATENT AND TRADEMARK OFFICE
CERTIFICATE OF CORRECTION

PATENT NO.          : 10,464,047 B2
APPLICATION NO.     : 14/360658
DATED               : November 5, 2019
INVENTOR(S)         : Lopez Quintela et al.

It is certified that error appears in the above-identified patent and that said Letters Patent is hereby corrected as shown below:

On the Title Page

Item (30) Foreign Application Priority Data:
"(EP) ......11382375" should be -- (EP) ......11382375.1 --.

Signed and Sealed this
Twenty-eighth Day of January, 2020

Andrei Iancu
*Director of the United States Patent and Trademark Office*